US011405047B2

(12) United States Patent
Jalili Sebardan et al.

(10) Patent No.: US 11,405,047 B2
(45) Date of Patent: Aug. 2, 2022

(54) SAMPLING SWITCH CIRCUITS

(71) Applicant: SOCIONEXT INC., Kanagawa (JP)

(72) Inventors: Armin Jalili Sebardan, Maidenhead (GB); Alistair John Gratrex, Maidenhead (GB); Mojtaba Bagheri, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/173,053

(22) Filed: Feb. 10, 2021

(65) Prior Publication Data
US 2021/0258016 A1    Aug. 19, 2021

(30) Foreign Application Priority Data
Feb. 17, 2020 (EP) ..................... 20157794

(51) Int. Cl.
*H03M 1/00* (2006.01)
*H03M 1/12* (2006.01)

(52) U.S. Cl.
CPC .................... *H03M 1/1245* (2013.01)

(58) Field of Classification Search
CPC .................................... H03M 1/1245
USPC ........................ 341/122, 155, 144
See application file for complete search history.

(56) References Cited

U.S. PATENT DOCUMENTS

| | | | | |
|---|---|---|---|---|
| 6,956,411 B1 * | 10/2005 | Holloway | ............... | G11C 27/02 327/384 |
| 7,136,000 B1 * | 11/2006 | Hidri | ................... | G11C 27/024 341/122 |
| 7,816,951 B1 * | 10/2010 | Lee | ...................... | G11C 27/024 327/94 |
| 2015/0200663 A1 | 7/2015 | Yang et al. | | |
| 2016/0027528 A1 | 1/2016 | Verbruggen et al. | | |

FOREIGN PATENT DOCUMENTS

JP    S63-275100 A    11/1988

OTHER PUBLICATIONS

Iizuka, Tetsuya, et al., "Comprehensive Analysis of Distortion in the Passive FET Sample-and-Hold Circuit," IEEE Transactions on Circuits and Systems-I: Regular Papers; 2018; pp. 1-17.
Extended European Search Report issued in European Patent Application No. 20157794.7, dated Jul. 10, 2020.

* cited by examiner

*Primary Examiner* — Peguy Jean Pierre
(74) *Attorney, Agent, or Firm* — McDermott Will & Emery LLP

(57) ABSTRACT

A sampling switch circuit, comprising: an input node, connected to receive an input voltage signal to be sampled; a sampling transistor comprising a gate terminal, a source terminal and a drain terminal, the source terminal connected to the input node; a potential divider circuit connected to the input node and a track-control node to provide a track-control voltage signal dependent on the input voltage signal at the track-control node; a hold-control node connected to receive a hold-control voltage signal; an output node connected to the drain terminal of the sampling transistor; and switching circuitry configured to connect the gate terminal of the sampling transistor to the track-control node or to the hold-control node in dependence upon a clock signal.

15 Claims, 19 Drawing Sheets

Prior Art

Prior Art

SAMPLING SWITCH CIRCUITS

CROSS-REFERENCE OF RELATED APPLICATIONS

This application claims the benefit of European Patent Application 20157794.7, filed on Feb. 17, 2020, the entire disclosure of which Application is incorporated by reference herein.

BACKGROUND OF THE INVENTION

The present invention relates to sampling switch circuits and circuitry, which may be referred to as sampling circuitry. Sampling switch circuits in line with the present invention may be referred to as sample-and-hold circuits or sample and hold switch circuits.

Voltage mode and current mode sampling is known in general terms, and a sample-and-hold circuit may be considered an example of a voltage mode sampling circuit. A previously-considered bootstrapping method will now be explored by way of introduction.

In a typical voltage mode sampler, a sampling transistor such as a field-effect transistor (FET) acts as a simple switch which is ON during a sampling (tracking) phase and is OFF during a hold phase. The on-resistance of the device (sampling transistor) depends on the input voltage (e.g. gate-source voltage in the case of a FET) which in turn creates harmonic distortion—i.e. input-dependent distortion. Where the voltage mode sampler is at the front end of an analogue-to-digital converter (ADC), the harmonic distortion may limit the dynamic range of the ADC.

A bootstrapping circuit may be used to provide or apply a constant voltage over the gate-source of the switch (during the sampling or tracking phase) which is—at least, theoretically—independent of the input signal. This minimizes the input-dependant on-resistance variations of the sampling switch.

FIG. 1 is a schematic diagram of a sampling switch circuit 1, useful for an overall understanding the bootstrapping concept. An input signal $V_{IN}$ is applied to the source (source terminal) of the sampling switch $M_S$. A voltage source $V_0$ (e.g. a battery) is then connected between the source and the gate (gate terminal), via a clock-controlled switch, so that the voltage $V_0+V_{IN}$ is applied to the gate of the sampling switch $M_S$ during the tracking phase where $V_0$ is a constant voltage. The gate is separately connected via another clock-controlled switch to ground (ground supply voltage). A sampling capacitor $C_S$ is connected to the drain (drain terminal) of the sampling switch $M_S$, which serves as the output node of the circuit 1, where an output signal $V_{OUT}$ is produced. The sampling capacitor $C_S$ is connected between the drain and ground.

Normally, $V_0=V_{DD}$ as shown, where $V_{DD}$ is the supply voltage, and this allows a maximum possible gate-source voltage over the device $M_S$ which creates the minimum on-resistance. In FIG. 1, CLK is the sampling clock (clock signal) with a frequency $f_s$.

The operation of the circuit 1 is as follows. When CLK is high (and –CLK is low), the gate of the sampling switch $M_S$ is connected to ground (ground supply voltage). The terms "high" and "low" may refer to voltage levels such as digital voltage levels, for example to $V_{DD}$ and GND (0 V) voltage levels, respectively. The transistor $M_S$ is thus OFF and the circuit 1 is in a hold phase where the sampled value (voltage) on the sampling capacitor $C_S$ is held. When CLK is low (–CLK is high), $V_{IN}+V_{DD}$ is applied to the gate of the switch. The transistor $M_S$ is thus ON and the circuit 1 now enters tracking mode and the voltage across the sampling capacitor $C_S$ tracks the input signal $V_{IN}$. The gate-source voltage in the tracking mode is thus $V_{IN}+V_{DD}-V_{IN}=V_{DD}$, i.e. independent of the input signal $V_{IN}$.

FIG. 2 shows a previously-considered bootstrapped circuit 10, as a detailed implementation of circuit 1, in which the voltage source $V_0$ (in other words, the battery in FIG. 1) is realized with a fairly large capacitor $C_B$.

The operation of the circuit 10 is as follows.

When the sampling clock is high (i.e., CLK=high), transistors $M_5$ and $M_{5t}$ are on which brings down the voltage on node G (i.e. at the gate of the sampling switch $M_S$) to ground. This turns OFF the sampling switch, $M_S$, and the hold phase starts in which the sampled value on the sampling capacitor $C_s$ is held. During this phase (i.e., the hold phase), transistors $M_2$ and $M_7$ are also OFF. The clock signal "–CLK" (which is an inverted version of the clock signal CLK) is low (i.e., –CLK=low). This turns OFF the transistor $M_6$ and turns ON transistor $M_8$. This brings up a voltage at the node Z to the supply, i.e., $V_{DD}$. Since node Z is now connected to $V_{DD}$, transistor $M_4$ is OFF. At the same time, since the voltage at node G is at ground (i.e. has a ground supply voltage), transistor $M_3$ is ON. The transistor $M_1$ is also ON (due to CLK=high). In this case, the capacitor $C_B$ is connected to ground (GND) at its bottom plate and connected to $V_{DD}$ at its top plate. This is thus also called the precharge phase, since as the sample is held on the sampling capacitor $C_S$, the capacitor $C_B$ is precharged to store the voltage $V_{DD}$.

When the sampling clock is low (i.e., CLK-low), the transistors $M_{5,5t}$ are switched OFF and thus node G is disconnected from ground. Transistor $M_8$ is quickly turned OFF and transistor $M_6$ is quickly turned ON (–CLK=high) and connects node X (whose voltage level is at ground at the beginning of this phase) to node Z which in turn brings down the voltage on node Z from $V_{DD}$ to ground. This turns on the transistor $M_4$ and connects node Y to node G. In this case, the voltage on node G starts to rise (since node Y was charged to $V_{DD}$ during the precharge/hold phase). While the voltage on node G is rising, the transistors $M_2$ and $M_7$ start to conduct (in other words, they turn ON). This raises the voltage at node Z and at node X towards the voltage of the input signal, $V_{IN}$. At this point, the voltage at node Y is raised to $V_{DD}+V_{IN}$ (since $V_{DD}$ is the initial voltage over the capacitor $C_B$). This voltage ($V_{DD}+V_{IN}$) is transferred to node G (i.e., the gate of sampling switch, $M_S$). In this case, the gate-source voltage of this switch is $V_{DD}+V_{IN}-V_{IN}=V_{DD}$ which is constant and independent of the input signal $V_{IN}$. As mentioned before, this phase is called the tracking phase, in which the sampling switch $M_S$ is ON and the voltage across the sampling capacitor $C_s$ tracks the input signal $V_{IN}$.

As an aside, in FIG. 2 the voltages across terminals of all switches (transistors) at all times are equal or less than the supply voltage, $V_{DD}$. This guarantees stress-free operation of the transistor circuitry.

In order to better understand the speed of the bootstrapped circuit 10 in FIG. 2, the circuit is analysed in precharge phase and tracking mode in more detail.

FIG. 3 is a schematic diagram of the circuit 10 in which certain elements are highlighted (not shown in dashed form) and others deemphasised (shown in dashed form) to help in an understanding of the precharge/hold phase (when, CLK=high).

As described before, during this phase, the capacitor $C_B$ is precharged to $V_{DD}$ (i.e. to store the voltage $V_{DD}$) through transistors $M_1$ and $M_3$. Meanwhile, $M_5$ and $M_{5t}$ force the gate of $M_S$ to ground and push the sampling transistor, $M_S$, into an OFF state. Transistor $M_8$ also keeps $M_4$ in OFF region. All other transistors are OFF, as indicated by being greyed out in FIG. 3.

First, the node G in FIG. 3 is discharged to ground with the following time constant:

$$\tau_{1,1} = (R_{on,M5} + R_{on,M5t}) \times C_G \quad (1)$$

Then, the capacitor $C_B$ is charged with the time constant of:

$$\tau_{1,2} = (R_{on,M1} + R_{on,M3}) \times C_B \quad (2)$$

where $R_{on,M5}$, $R_{on,M5t}$, $R_{on,M1}$, and $R_{on,M3}$ refer to the on-resistances of the devices $M_5$, $M_{5t}$, $M_1$, and $M_3$, respectively and $C_G$ is the summation of all parasitic capacitances on node G:

$$C_G = C_{gs5} + C_{gd5} + C_{db5t} + C_{db4} + C_{gs3} + C_{gd3} + C_{gs2} + C_{gd2} + C_{gs7} + C_{gd7} \quad (3)$$

The contribution of other transistors in the gate capacitance of $M_S$ can be seen in (3). The precharge time constant can be calculated as the summation of the two time constants calculated in (1) and (2):

$$\tau_{precharge} = \tau_{1,1} + \tau_{1,2} \quad (4)$$

Typically, the discharge of the node G happens much faster than precharge (due to relatively high strength of switches $M_5$ and $M_{5t}$). So, (4) can be simplified as follows:

$$\tau_{precharge} \sim \tau_{1,2} \quad (5)$$

FIGS. 4A and 4B are schematic diagrams of the circuit 10 in which certain elements are highlighted (not shown in dashed form) and others deemphasised (shown in dashed form) to help in an understanding of the tracking phase (when, CLK=low).

When the clock signal, CLK, goes low, the transistor $M_6$ is quickly switched ON. This happens with a time constant as follows:

$$\tau_{2,1} = R_{on,M6} \times C_Z \quad (6)$$

where $R_{on,M6}$ is the on-resistance of the device $M_6$ and $C_Z$ is the total capacitance on node Z:

$$C_Z = C_{gs4} + C_{gd4} + C_{db6} + C_{db7} + C_{db8} \quad (7)$$

Next, and when $M_4$ is already ON, the voltage level at the top plate of $C_B$—which was precharged to voltage level $V_{DD}$—appears at the gate of $M_S$ through the on-resistance of $M_4$. $V_G$ (i.e. the voltage level at the gate node G) starts to rise and once it reaches the threshold voltage of $M_2$, this transistor turns ON and connects the bottom plate of $C_B$ to the input voltage $V_{IN}$. Following this, $V_X$ and $V_Y$ (i.e., the voltages on nodes X and Y) increase by $V_{IN}$ with a time constant of:

$$\tau_{2,2} = (R_{on,M2} + R_{on,M4}) \times C_G \quad (8)$$

where $R_{on,M2}$ and $R_{on,M4}$ are the on-resistances of the devices $M_2$, and $M_4$, respectively.

FIGS. 4A and 4B shows the bootstrapped circuit 10 during the time constants $\tau_{2,1}$, and $\tau_{2,2}$, respectively.

The overall tracking time constant can be calculated as:

$$\tau_{track} = \tau_{2,1} + \tau_{2,2} \quad (9)$$

The maximum sampling clock frequency can thus be calculated using the summation of the time constants calculated above as follows:

$$\omega_{s,max} = 2\pi \times f_{s,max} = 1/(\tau_{precharge} + \tau_{track}) \quad (10)$$

Since $C_B$ is much larger than the total parasitic capacitances $C_G$, and $C_Z$, (10) can be simplified as:

$$\omega_{s,max} = 2\pi \times f_{s,max} \sim 1/[(R_{on,M1} + R_{on,M3}) \times C_B] \quad (11)$$

In practice, several time constants are needed to reach a proper settling time depending on the required resolution. So, the maximum sampling frequency is typically a fraction of the estimated $f_{s,max}$ in (11). However, this is used as a simple criterion to compare the speed of embodiments of the present invention (described later) with the bootstrapped structure of circuit 10 of FIG. 2.

It is noted that the transition of the circuit 10 from the state shown in FIG. 4A to that shown in FIG. 4B comprises a time interval in which the voltage on node G is raised above the threshold voltage of $M_2$ and $M_7$. This time interval acts like an intrinsic delay which eventually slows down operation of the circuit 10.

The inventors have further considered the operation of circuit 10 of FIG. 2 as described above in relation to ultra-high sampling frequencies. In particular, the circuit 10 has three major problems which limit its maximum frequency operation in practice, as follows.

Firstly, there is relatively large capacitor $C_B$ (acting as a battery in the tracking phase) which is switched on/off (charged/discharged) at the same rate as the sampling frequency (as it is in the switching path). Due to charge sharing (which occurs during the tracking phase) with the parasitic capacitors at node G, a relatively large capacitance value may be chosen for this capacitor so that it substantially maintains the $V_{DD}$ voltage. This makes it very difficult as the sampling frequency increases since a huge capacitor then needs to be precharged and switched to be over the gate-source of the sampling switch $M_S$.

Secondly, the transistor count is significant at ultra-high speed sampling frequencies since a large transistor count (as in FIG. 2) creates a large amount of parasitic capacitance. In FIG. 2, for the sampling switch $M_S$, there are nine devices (transistors) which may be designed to be of the same order of area/size as the main sampling switch $M_S$. As explained above, the total capacitance on node G determines the time constant which turns ON/OFF the state of the sampling switch $M_S$. This capacitance is dictated by the gate capacitances of the four main devices $M_S$, $M_2$, $M_3$, and $M_7$. The bootstrapped circuit 10 of FIG. 2 thus deals with roughly four times the gate capacitance of the sampling switch $M_S$ (instead of just one), which increases the time constant of the circuit during tracking phase.

Thirdly, when the clock signal changes its state (from high to low or low to high), transistors $M_5$, $M_{5t}$, $M_1$, $M_6$, and $M_8$ change their states very quickly while transistors $M_2$, $M_3$, and $M_7$ change their states depending on the voltage variations on node G. This acts as an intrinsic delay in the structure where the states of three devices are not quickly changed with the clock signal. Increasing the area of the devices could reduce their on-resistances to make the time constants smaller. However this, on the other hand, would generate more parasitic capacitance which would contribute to the parasitic capacitances $C_G/C_Z$ and in turn counteract the lower on-resistance effect.

Thus, with the above in mind, when the sampling frequency is pushed towards higher frequencies, three destructive/failed mechanisms start to occur which corrupt the high frequency operation of the circuit 10, as follows.

Firstly, due to the relatively large time constant of the precharge time (see equation (2)), the capacitor $C_B$ might not fully charge at high frequencies. So, as the sampling frequency is increased, the stored charge may drop so that the voltage across the capacitor $C_B$ drops from $V_{DD}$. As mentioned earlier, this charge (and the resultant voltage) is required to configure the sampling switch $M_S$ at its maximum conductive state (minimum on-resistance).

Secondly, the charge stored on the capacitor $C_B$ (and the resultant voltage across it) is also used to turn on $M_2$. So, as the sampling frequency is increased $M_2$ will eventually only be partially ON. As mentioned before, $M_2$ needs to be ON to put $V_{IN}$ at the bottom plate of $C_B$ to reconstruct $V_{IN}+V_{DD}$ on node G. This is the second failed mechanism.

The third failed mechanism is due to the voltage on node Z. As mentioned before, at the beginning of the tracking phase, the voltage on node Z is discharged from $V_{DD}$ to ground through $M_6$. Then, this voltage is raised to $V_{IN}$ as the transistor $M_7$ is turned on. As the sampling frequency is increased (lowering the clock period), the voltage at node Z is dropped to ground but there is not enough time to raise it towards $V_{IN}$.

Voltage mode ADCS (having such sampling switch circuits as a voltage mode sampler front-end) typically use the bootstrapping technique to enhance the dynamic range of the converter. For network applications, this probably can be avoided due to the low resolution nature of applications in that technical area. For 5G applications, however, where high speed and high resolution are required, current bootstrapping techniques seem to be impractical as mentioned above.

SUMMARY OF THE DISCLOSURE

It is desirable to address one or more of the above problems, and in particular to provide sampling switch circuits which have improved performance for example at higher speeds of operation. It is desirable to provide improved sampling switch circuits which may be used as a voltage mode sampler front-end for an ADC, e.g. for use in direct RF applications.

According to an embodiment of a first aspect of the present invention, there is provided a sampling switch circuit, comprising: an input node, connected to receive an input voltage signal to be sampled; a sampling transistor comprising a gate terminal, a source terminal and a drain terminal, the source terminal connected to the input node; a potential divider circuit connected to the input node and a track-control node to provide a track-control voltage signal dependent on the input voltage signal at the track-control node; a hold-control node connected to receive a hold-control voltage signal; an output node connected to the drain terminal of the sampling transistor; and switching circuitry configured to connect the gate terminal of the sampling transistor (either) to the track-control node or to the hold-control node in dependence upon a clock signal.

Such a sampling switch circuit may be referred to, for example, as a sampling circuit, a sampler circuit, a sampler front-end circuit, an ADC front-end circuit, a sample-and-hold circuit or a sample and hold switch circuit. The potential divider circuit enables at least the track-control voltage signal to be provided at the track-control node based on the input voltage signal, so that the track-control voltage signal is available to control the sampling transistor (e.g. without needing to charge up a capacitor such as $C_B$ in the FIG. 2 circuitry).

It will be understood that connections herein may be circuit connections, for example conductive connections (and may involve DC connections and/or AC connections via a capacitor). Voltages provided at a node may be applied at or generated at that node.

The potential divider circuit may be configured such that, when the gate terminal of the sampling transistor is connected to the track-control node, the sampling transistor is ON and a voltage at the drain terminal of the sampling transistor and/or the output node tracks a voltage at the source terminal of the sampling transistor.

The sampling switch circuit may comprise a sampling capacitor connected to the output node, optionally between the output node and a ground supply node. Such a sampling capacitor may serve to hold a voltage level at the output node. When the gate terminal of the sampling transistor is connected to the hold-control node, the sampling transistor may be OFF and a voltage at the drain terminal of the sampling transistor and/or at the output node may be at least temporarily maintained or held.

The potential divider circuit may be at least one of: an impedance circuit; a resistor circuit; a resistor network; a passive circuit; and a linear circuit. A resistor circuit/resistor network may comprise resistors (amongst other components) or the components thereof may all be resistors.

The track-control voltage signal may have a track-control AC component defined at least by the input voltage signal and a track-control DC component defined at least by the potential divider circuit. The potential divider circuit may be configured to maintain the track-control voltage signal at the track-control node, optionally with the track-control AC component maintained as defined at least by the input voltage signal and the track-control DC component maintained as defined at least by the potential divider circuit, optionally as continuous signals and optionally independently of the clock signal.

The potential divider circuit may be connected to a sample node to provide a sample voltage signal at the sample node which has a sample AC component defined at least by the input voltage signal and a sample DC component defined at least by the potential divider circuit, the source terminal of the sampling transistor connected to the sample node and connected to the input node via the sample node. The sample voltage signal may be representative of the input voltage signal, for example (e.g. directly) proportional to the input voltage signal. The potential divider circuit may be configured to maintain the sample voltage signal at the sample node, optionally with the sample AC component maintained as defined at least by the input voltage signal and the sample DC component maintained as defined at least by the potential divider circuit, optionally as continuous signals and optionally independently of the clock signal.

The potential divider circuit may be configured such that the track-control DC component and the sample DC component are different from one another in voltage level. A difference between voltage levels of the track-control DC component and the sample DC component may be greater than or equal to the threshold voltage of the sampling transistor. The difference between voltage levels of the track-control DC component and the sample DC component may be sufficient to turn the sampling transistor ON when the gate terminal is connected to the track-control node, optionally fully ON.

The potential divider circuit may be connected to a first reference node and a second reference node, the first reference node connected to receive a first reference voltage signal having a first reference DC component and the second reference node connected to receive a second reference voltage signal having a second reference DC component. The first reference DC component and the second reference DC component may be configured to cause the difference between voltage levels of the track-control DC component and the sample DC component to be greater than or equal to the threshold voltage of the sampling transistor.

The first reference voltage signal and/or the second reference voltage signal may be a DC voltage signal. The first reference node may be connected to a voltage supply node, for example having a voltage level different from (higher than) that of a $V_{DD}$ supply node. The second reference node may be connected to a voltage supply node, such as a ground supply node or a voltage supply node having a voltage level different from that of a ground supply node.

The potential divider may comprise: a first impedance connected between the input node and the track-control node; a second impedance connected between the track-control node and the first reference node; a third impedance connected between the input node and the sample node; and a fourth impedance connected between the sample node and the second reference node.

The first to fourth impedances may consist of, be or comprise resistors.

The first impedance may be implemented as a resistor or as a resistor connected in series with a capacitor, or as a resistor connected in parallel with a capacitor, or as a capacitor connected in series with a parallel combination of impedances, the parallel combination of impedances comprising a resistor connected in parallel with a capacitor.

The second impedance may be implemented as a resistor, or as a resistor connected in series with an inductor.

The third impedance may be implemented as a resistor, or as a resistor connected in parallel with a capacitor.

The fourth impedance may be implemented as a resistor, or as a resistor connected in series with a parallel combination of impedances, that parallel combination of impedances comprising a resistor connected in parallel with a capacitor, optionally wherein that parallel combination of impedances is connected to the second reference node.

The hold-control voltage signal may have a hold-control DC component, and a difference between voltage levels of the hold-control DC component and the sample DC component may be less than the threshold voltage of the sampling transistor. The difference between voltage levels of the hold-control DC component and the sample DC component may be sufficient to turn the sample transistor OFF when the gate terminal is connected to the hold-control node. The hold-control voltage signal may be a DC voltage signal. The hold-control voltage signal may be a ground supply signal. The hold-control node may be connected to a voltage supply node such as a ground supply node.

The switching circuitry may comprise a first switch connected between the gate terminal of the sampling transistor and the track-control node and a second switch connected between the gate terminal of the sampling transistor and the hold-control node. The first and second switches may be connected to be controlled by said clock signal so that when one of the switches is ON the other of them is OFF. The first and second switches may be implemented with transistors.

The first switch may be connected in series with a resistance between the gate terminal of the sampling transistor and the track-control node, optionally wherein that resistance is implemented with one or more transistors. The second switch may be connected in series with a resistance between the gate terminal of the sampling transistor and the hold-control node, optionally wherein that resistance is implemented with one or more transistors.

The sampling switch circuit may be configured to have multiple channels (each channel may correspond to a different phase of a multi-phase clock signal). Each channel may comprise its own said sampling transistor, output node, switching circuitry and clock signal. For each channel, the source terminal of the sampling transistor may be connected to the input node, the output node may be connected to the drain terminal of the sampling transistor, and the switching circuitry may be configured to connect the gate terminal of the sampling transistor to the track-control node or to the hold-control node in dependence upon the clock signal.

According to an embodiment of a second aspect of the present invention, there is provided a sampling switch circuit comprising: a sampling switch transistor connected between an input node and an output node; a sampling capacitor connected between the output node and a ground node; a first transistor connected between a gate of the sampling switch transistor and an intermediate node; a second transistor provided between the gate of the sampling switch transistor and the ground node; and a resistor circuit connected between the input node and a reference voltage node and configured to generate a voltage for driving the sampling switch transistor based on an input voltage and a reference voltage at the intermediate node, wherein the gates of the first and second transistors are connected to a clock input node, respectively, so that the first and second transistors turn on and off alternately.

According to an embodiment of a third aspect of the present invention, there is provided an analogue-to-digital converter, comprising the sampling switch circuit according to the aforementioned first or second aspect of the present invention.

According to an embodiment of a fourth aspect of the present invention, there is provided integrated circuitry, such an IC chip, comprising the sampling switch circuit according to the aforementioned first or second aspect of the present invention, or the analogue-to-digital converter according to the aforementioned third aspect of the present invention.

BRIEF DESCRIPTION OF THE DRAWINGS

Reference will now be made, by way of example, to the accompanying drawings, of which.

DETAILED DESCRIPTION OF THE DISCLOSURE

Embodiments of the present invention seek to address the above problems.

Figure 1:
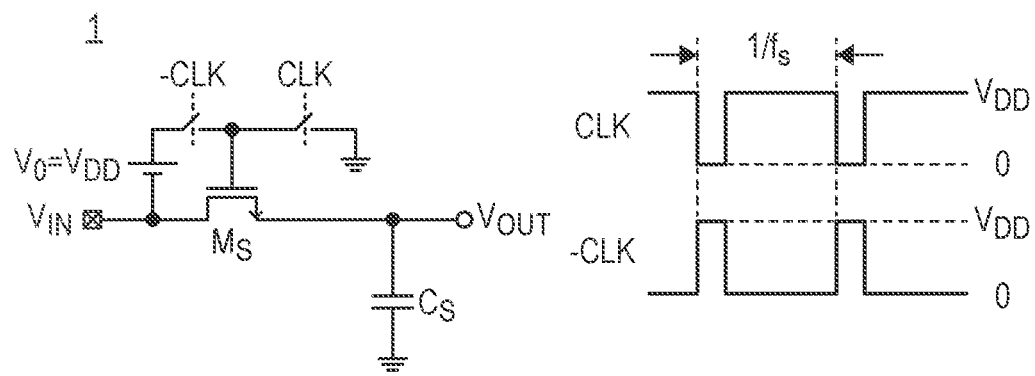
FIG. 1, as mentioned above, is a schematic diagram of a previously-considered sampling switch circuit.
Figure 2:
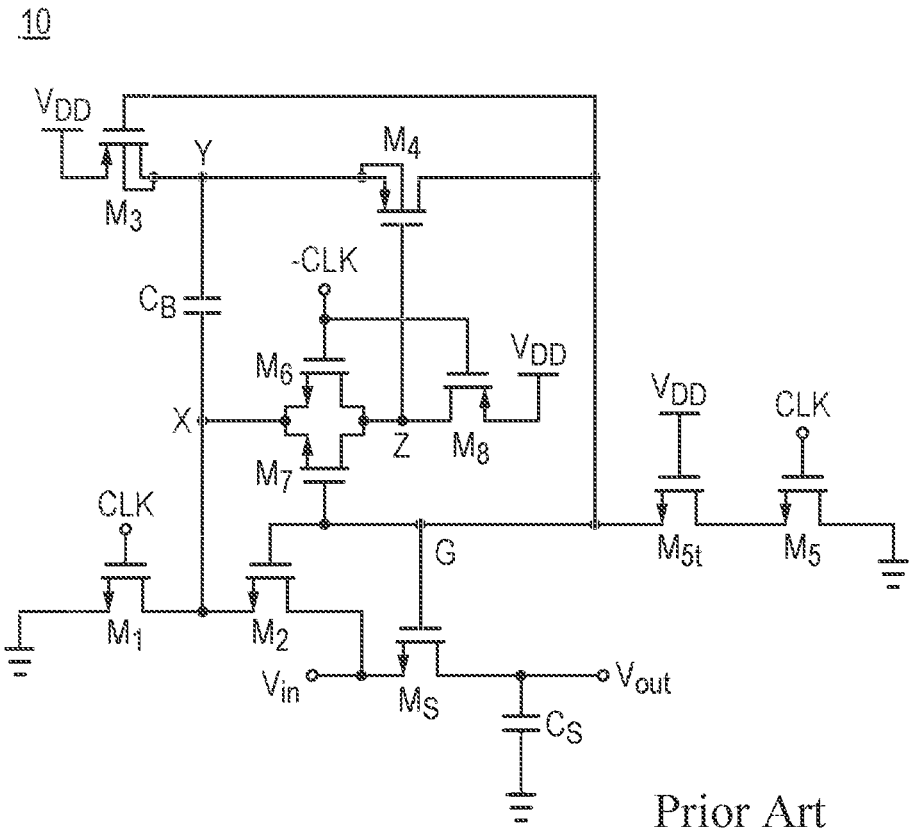
FIG. 2 shows a previously-considered bootstrapped circuit, as a detailed implementation of the FIG. 1 circuit.
Figure 3:
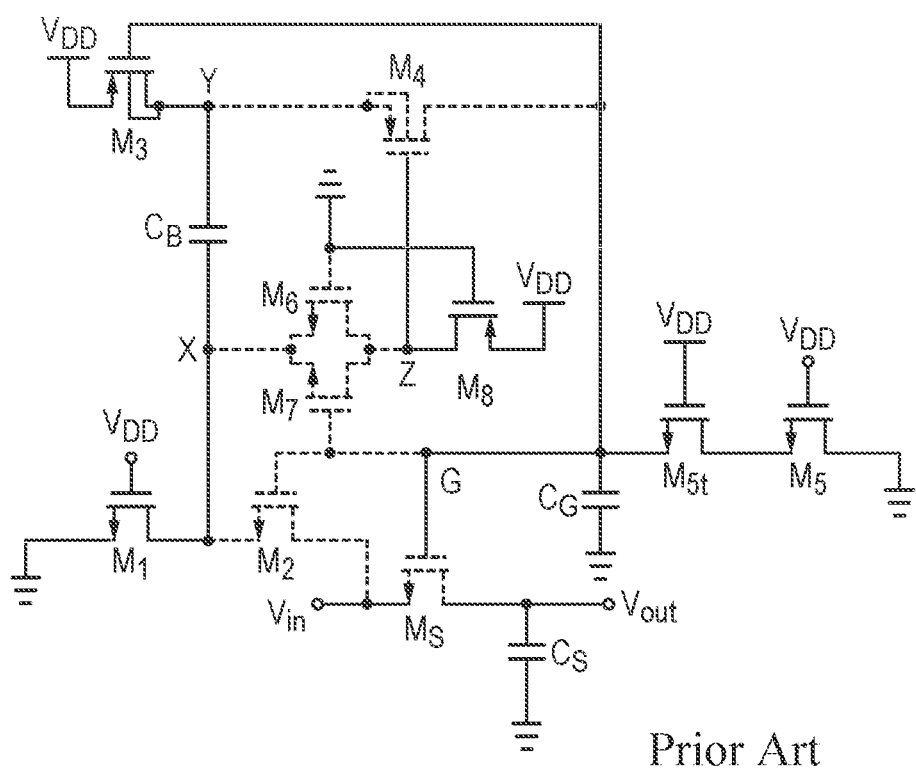
FIG. 3 is a schematic diagram of the FIG. 2 circuit for use in an understanding of the precharge/hold phase.
Figure 4A:
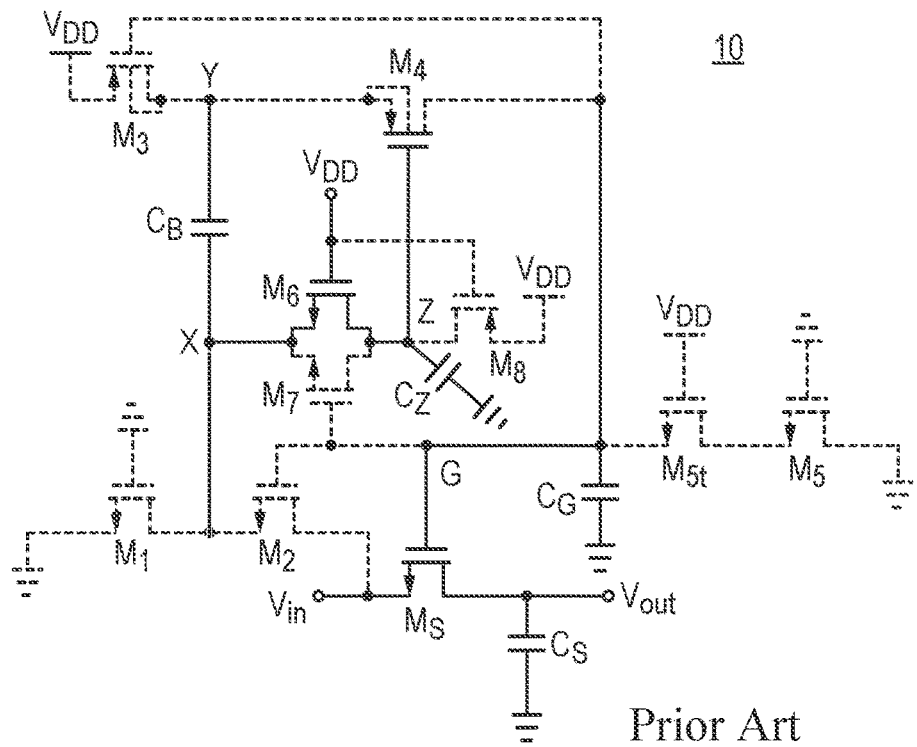
FIGS. 4A and 4B are schematic diagrams of the FIG. 2 circuit for use in an understanding of the tracking phase.
Figure 4B:
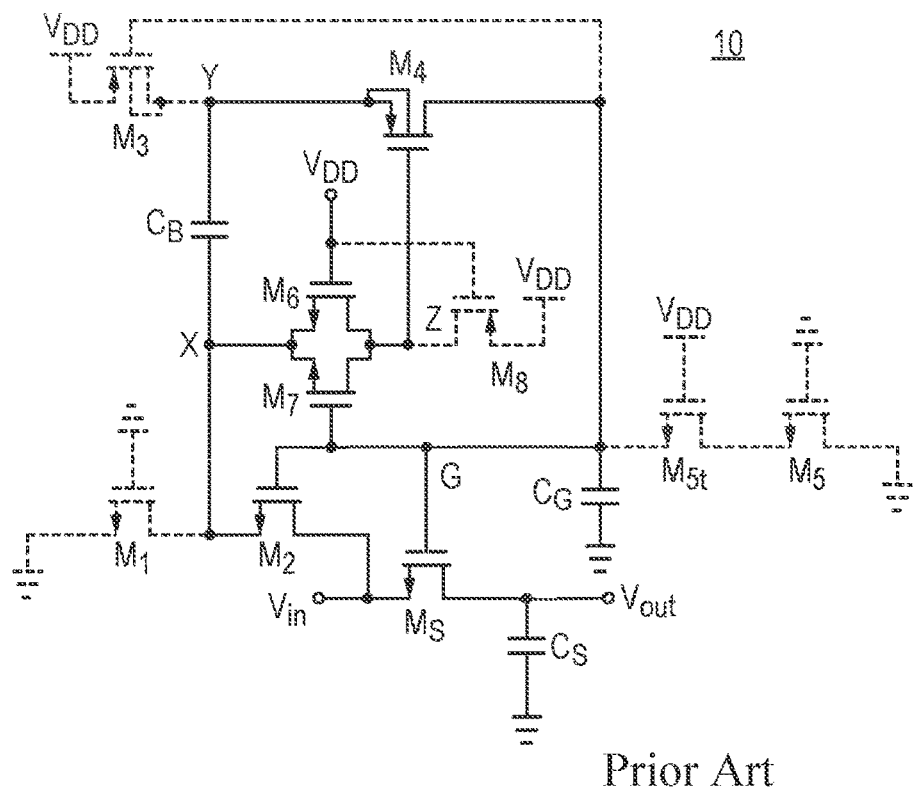

In particular, by way of overview and recalling the discussion of FIGS. 2 to 4, in embodiments the precharge phase is rendered unnecessary by removing the bulky capacitor $C_B$ from the switching path. By removing the precharge phase, the maximum operation frequency of the clocking circuit is boosted considerably. Further, the state of devices (transistors) is rendered dependent either on clock signals or the input voltage, rather than on the voltage at the gate of the sampling device $M_S$. The total capacitance at the gate of the sampling switch $M_S$ is also reduced (e.g. by reducing the number of devices—transistors—connected to that node), which enables the tracking time constant to be enhanced (i.e. reduced).

Figure 5:
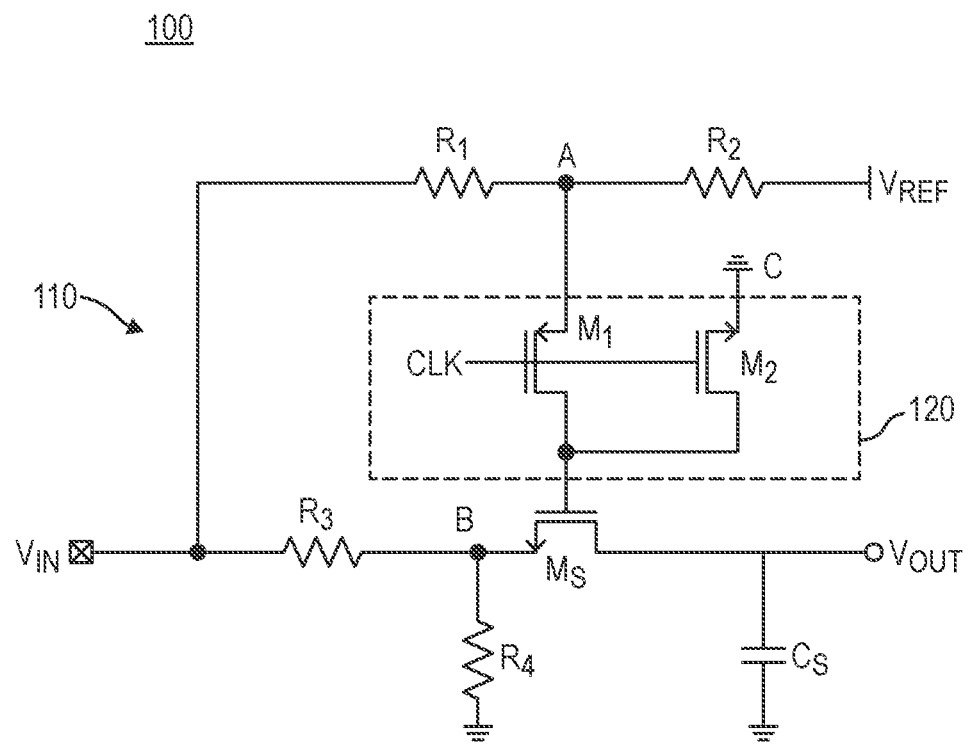
FIG. 5 is a schematic diagram of a sampling switch circuit embodying the present invention.

FIG. 5 is a schematic diagram of a sampling switch circuit 100 embodying the present invention. The sampling switch circuit 100 may be referred to for example as a sampling circuit, a sampler circuit, a sampler front-end circuit, an ADC front-end circuit, a sample-and-hold circuit or a sample and hold switch circuit, and the present disclosure will be understood accordingly. Variants of the sampling switch circuit 100, also embodying the present invention, will be considered later herein. Compared to the sampling switch circuit 10, the need for the fairly large capacitor (i.e., $C_B$) has been removed and the transistor count has been reduced.

The sampling switch circuit 100 comprises an input node (marked as $V_{IN}$), a sampling transistor (sampling switch) $M_S$, a potential divider circuit 110, a track-control node (node A), a sample node (node B), a hold-control node (node C), switching circuitry 120 and an output node (marked as $V_{OUT}$).

The input node is connected to receive an input voltage signal $V_{IN}$ to be sampled. The sampling transistor $M_S$ comprises a gate terminal, a source terminal and a drain terminal, the source terminal connected to the input node. The potential divider circuit 110 is connected to the input node and the track-control node (node A) to provide a track-control voltage signal dependent on the input voltage signal $V_{IN}$ at the track-control node. The hold-control node (node C) is connected to receive a hold-control voltage signal, in this case a ground supply voltage signal. The switching circuitry 120 is configured to connect the gate terminal of the sampling transistor (either) to the track-control node (node A) or to the hold-control node (node C) in dependence upon a (sampling) clock signal CLK.

In FIG. 5, the potential divider circuit 110 comprises resistors $R_1$ to $R_4$ (in later variants, further components are provided). The resistor $R_1$ is connected between the input node and node A. The resistor $R_2$ is connected between node A and a first reference node (marked as $V_{REF}$) which is connected to receive a first reference signal $V_{REF}$, which in this case is a DC (supply) voltage signal (a DC reference voltage) which may be assumed to be higher in voltage level than the (core) supply voltage $V_{DD}$. The third resistor $R_3$ is connected between the input node and node B, which is connected to the source terminal of the sampling transistor $M_S$. The fourth resistor $R_4$ is connected between node B and a second reference node which is connected to receive a second reference signal, which in this case is a ground supply voltage signal.

Thus, the potential divider circuit 110 is connected to the track-control node (node A) to provide a track-control voltage signal which has a track-control AC component defined at least by the input voltage signal $V_{IN}$ and a track-control DC component defined at least by the potential divider circuit 110. Similarly, the potential divider circuit 110 is connected to the sample node (node B) to provide a sample voltage signal at the sample node (node B) which has a sample AC component defined at least by the input voltage signal $V_{IN}$ and a sample DC component defined at least by the potential divider circuit 110, the source terminal of the sampling transistor $M_S$ connected to the sample node (node B) and connected to the input node via the sample node (node B).

The switching circuitry 120 comprises transistors $M_1$ and $M_2$ which act as switches of the switching circuitry 120 and are controlled at their gate terminals by the clock signal CLK. $M_1$ is connected with its channel between the gate terminal of $M_S$ (marked as node G') and node A, and $M_2$ is connected with its channel between node G' and node C.

Transistors $M_S$, $M_1$ and $M_2$ are shown as FETs, for example MOSFETS, with $M_S$ and $M_2$ being NMOS (n-channel) devices and $M_1$ being a PMOS (p-channel) device. Thus, $M_1$ connects node A to the gate node G' of $M_S$ when CLK is low and turns ON the sampling switch $M_S$ (as explained below), while $M_2$ connects node C to the gate node G' of $M_S$ and turns OFF the sampling switch $M_S$ when CLK is high.

The output node is connected to the drain terminal of the sampling transistor $M_S$. A sampling capacitor $C_S$ is connected between the output node and ground.

In order better to appreciate the operation of the circuit 100, the voltages at nodes A and B will be considered in more detail.

Figure 6:
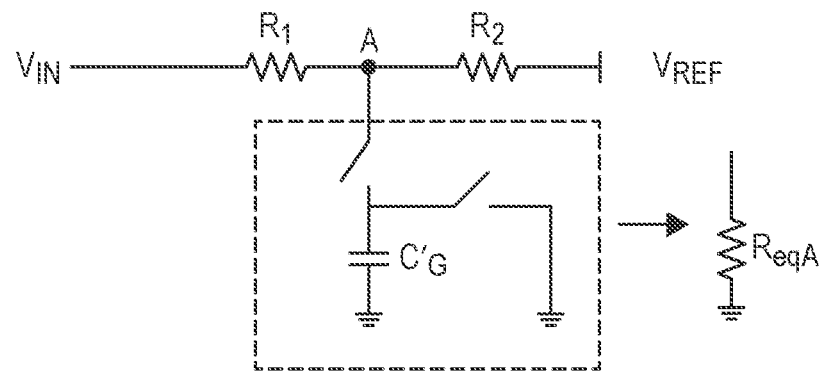
FIG. 6 shows a simplified circuit model representing the voltage on node A of the circuit of FIG. 5.

First, the voltage on node A (track-control voltage signal) will be considered. FIG. 6 shows a simplified circuit model representing the voltage on node A of the circuit 100. In FIG. 6, $R_{eqA}$ is the equivalent resistance seen on node A because of the switching activity of transistors $M_1$, $M_2$ and the gate capacitance of $M_S$, i.e., $C'_G$:

$$C'_G = C_{gsS} + C_{gdS} + C_{db1} + C_{db2} \quad (12)$$

At first glance, as can be seen in (12), the capacitance on node G' ($C'_G$) only involves the gate capacitance of $M_S$ (which is different from $C_G$ in (3)).

The equivalent resistance $R_{eqA}$ can be represented (approximately on average) as:

$$R_{eqA} \sim 1/(f_s \times C'_G) \quad (13)$$

where $f_s$ is the sampling frequency (i.e., the frequency of CLK signal). The resistors $R_1$ and $R_2$ may advantageously be designed such that:

$$R_{eqA} >> R_1 \| R_2 \quad (14)$$

where $>>$ is the "is much larger than" sign and means in parallel.

Figure 7:
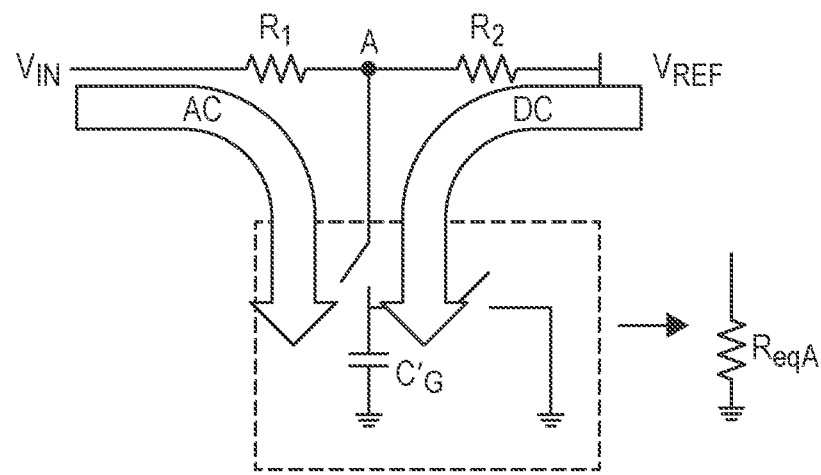
FIG. 7 is a schematic diagram equivalent to FIG. 6 but indicating AC and DC power flows.

Equation (14) demonstrates an aspect of the circuit 100 in FIG. 5. It is advantageous to have the resistance values of the resistors $R_1$ and $R_2$ small enough to allow enough AC power flowing from the input node and DC power from the reference voltage towards the node A. The concept is schematically shown in FIG. 7, which is equivalent to FIG. 6 but indicating the AC and DC power flows.

According to the circuit of FIG. 6 we have:

$$V_A = (g_1/\Sigma g_A) \times V_{IN} + (g_2/\Sigma g_A) \times V_{REF} \quad (15)$$

where $g_1 = 1/R_1$, $g_2 = 1/R_2$, $g_{eqA} = 1/R_{eqA}$ and $$\Sigma g_A = g_1 + g_2 + g_{eqA} \quad (16)$$

Figure 8:
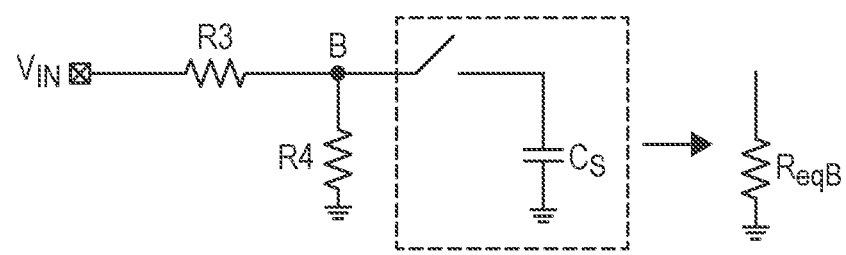
FIG. 8 shows a simplified circuit model representing the voltage on node B of the circuit of FIG. 5.

The voltage on node B (sample voltage signal) in FIG. 5 can be calculated in a similar equivalent circuit as shown in FIG. 8, where $R_{eqB}$ is the equivalent impedance seen from the switching activity of the sampling switch $M_S$ and the capacitor $C_S$.

According to FIG. 8, the voltage at node B can be estimated as:

$$V_B = g_3/(g_3 + \Sigma g_B) \times V_{IN} \quad (17)$$

where $g_3 = 1/R_3$, $g_4 = 1/R_4$, $g_{eqB} = 1/R_{eqB}$, and $$\Sigma g_B = g_4 + g_{eqB} \quad (18)$$

The effective gate-source voltage $V_{GS}$ over the sampling switch $M_S$ (i.e. $V_{GS,MS}$) during the tracking mode or phase can be calculated as the difference between the voltages of nodes A and B:

$$V_{GS,MS} = V_A - V_B = (g_1/\Sigma g_A - g_3/(g_3 + \Sigma g_B)) \times V_{IN} + (g_2/\Sigma g_A) \times V_{REF} \quad (19)$$

With the same concept as the bootstrapped switch, i.e. in order to have a linear sampling switch $M_S$, the first term in (19) (i.e., the input-signal-dependant term) should be designed to be at least approximately equal to zero:

$$g_1/\Sigma g_A - g_3/(g_3 + \Sigma g_B) = 0 \quad (20)$$

In this case, the gate source voltage in (19) is reduced (at least, approximately) to:

$$V_{GS,MS} = (g_2/\Sigma g_A) \times V_{REF} \quad (21)$$

This gate-source voltage is constant and independent of the input signal $V_{IN}$.

It should be noted that in connection with FIGS. 5 to 8 it is assumed that the input signal $V_{IN}$ is assumed to be DC-connected at the input node, so that it applies both DC and AC components. Thus, for example, equation (17) implicitly includes a DC component term given that it includes $V_{IN}$. It would however be possible to AC connect the input signal $V_{IN}$ at the input node (i.e. via a decoupling capacitor).

The circuit 100 of FIG. 5 also has advantages from the point of view of input impedance matching.

Figure 9:
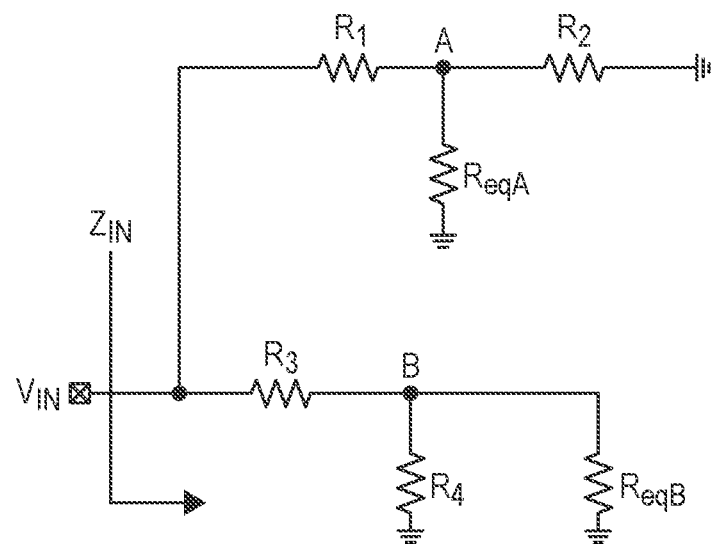
FIG. 9 is a schematic diagram showing a simplified circuit model representing the FIG. 5 with a focus on its potential divider circuit.

In particular, the potential divider circuit 100, implemented as a resistive network or resistor circuit as explained earlier, offers an equivalent input impedance which can be utilized for the sake of impedance matching in high-speed applications. Reference is made to FIG. 9, which is a schematic diagram showing a simplified circuit model representing the circuit 100 with a focus on the potential divider circuit 110.

The equivalent input impedance $Z_{IN}$ as seen at the input node may be calculated as:

$$Z_{IN} = (R_1 + R_2 \| R_{eqA}) \| (R_3 + R_4 \| R_{eqB}) \quad (22)$$

As the input frequency ($f_{in}$) increases, i.e. looking at frequencies of the input signal $V_{IN}$, the parasitic capacitance on node B (which is mainly due to the drain-bulk capacitance of the sampling switch, $M_S$) kicks in or becomes dominant and reduces the effective impedance seen from node B.

Figure 10:
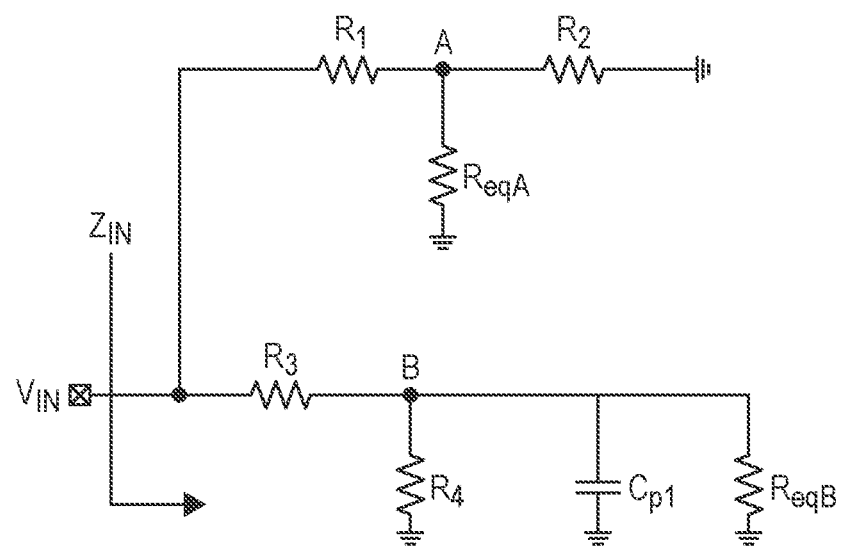
FIG. 10 is a schematic diagram similar to FIG. 9 but showing a parasitic capacitance explicitly.

Reference is made to FIG. 10, which is a schematic diagram similar to FIG. 9 but showing the parasitic capacitance $C_{p1}$ at node B explicitly. Taking account of the parasitic capacitance $C_{p1}$ at higher input frequencies, the equivalent input impedance $Z_{IN}$ as seen at the input node, may be calculated as:

$$Z_{IN} = (R_1 + R_2 \| R_{eqA}) \| (R_3 + R_4 \| R_{eqB} \| (1/2 \times \pi \times f_{in} \times C_{p1})) \quad (23)$$

In order to consider reflections in an example design scenario, without losing any generality, it will be assumed in an example application that the resistance designed for the clocking branch (i.e., $R_1 + R_2 \| R_{eqA}$) is higher than the resistance seen from the signal path:

$$(R_1 + R_2 \| R_{eqA}) >> [R_3 + R_4 \| R_{eqB} \| (1/2 \times \pi \times f_{in} \times C_{p1})] \quad (24)$$

This means that $$Z_{IN} \sim R_3 + R_4 \| R_{eqB} \| (1/2 \times \pi \times f_{in} \times C_{p1}) \quad (25)$$

At low input frequency, the input impedance in (25) is reduced to:

$$Z_{IN,L} \sim R_3 + R_4 \| R_{eqB} \quad (26)$$

And at high input frequency:

$$Z_{IN,H} \sim R_3 \quad (27)$$

At low input frequency, the input impedance in (26) is designed in the example application to be equal to the characteristic impedance, $Z_0$ (e.g., 50 ohms):

$$Z_{IN,L} \sim R_3 + R_4 \| R_{eqB} = Z_0 \quad (28)$$

In this case, at high input frequencies, the reflection measure/coefficient or S-parameter $S_{11}$ can be calculated as:

$$S_{11} = 20 \times \log_{10}(|Z_{IN,H} - Z_0|/(Z_{IN,H} + Z_0)) \quad (29)$$

Substituting (27) and (28) into (29) results in:

$$S_{11} = 20 \times \log_{10}((R_4 \| R_{eqB})/(2R_3 + R_4 \| R_{eqB})) \quad (30)$$

An interesting aspect of the voltage division between $R_3$ and $R_4$ relates to the reflection coefficient (i.e., $S_{11}$) in (30). If $R_4$ is much larger than $R_3$, then most of the input power ($V_{IN}$) will pass through the sampling switch $M_S$, but this degrades the $S_{11}$. On the other hand, losing a fraction of the input power can help to boost $S_{11}$ according to (30). For example, in 5G applications, where the input signal coming from a LNA (low-noise amplifier) might be prone to a very large blocker (a high power signal in the same frequency range), this voltage division can actually help increase the linear range of an ADC (comprising the circuit 100 at its front end) along with improvement in $S_{11}$ at the same time.

Figure 11:
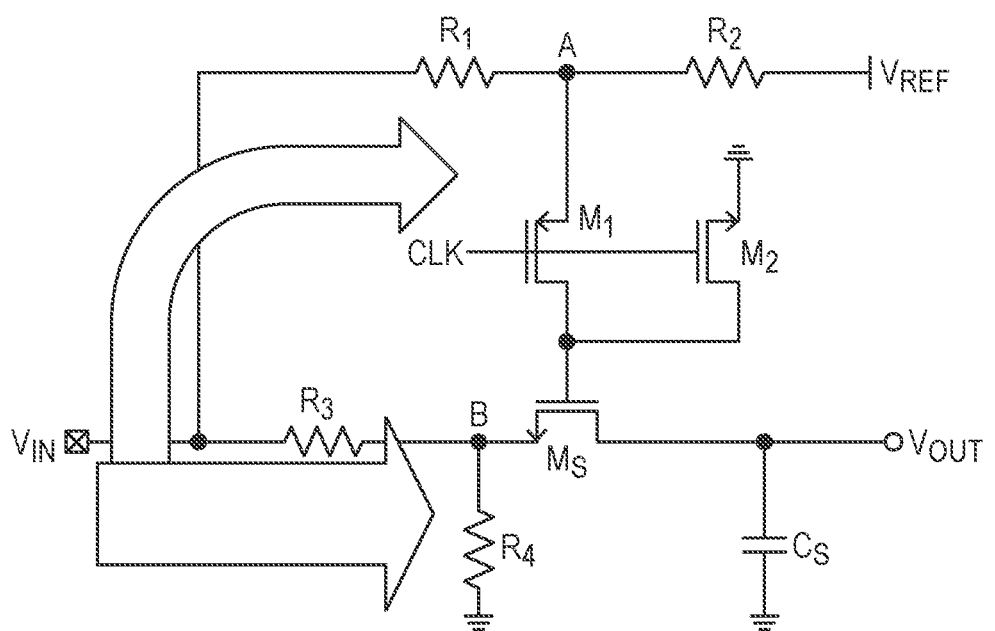
FIG. 11 is a schematic diagram equivalent to FIG. 5 but indicating respective power flows.

The $S_{11}$ calculated in (30) was with an assumption made in (24). Thus, the $S_{11}$ depends on the design and how power flow from the input node towards the clocking path and the sampling switch (i.e., the signal path) is controlled. This concept is schematically shown in FIG. 11, which is equivalent to FIG. 5 but indicating the respective power flows. Different design scenarios entail different output signal swing, $S_{11}$, clocking accuracy (and eventually effective number of bits (ENOB), spurious free dynamic range (SFDR) in an ADC implementation) etc.

The speed of the circuit 100 will now be considered, compared with the bootstrapped circuit 10 of FIG. 2. In the circuit 100, the main capacitor in the clocking path is the gate capacitance of the sampling switch $M_S$ (i.e., $C'_G$ in (12)). On the other hand, in the bootstrapped circuit 10, as mentioned before, the capacitor $C_B$ is in the clocking path which is normally much larger than $C'_G$.

Figure 12:
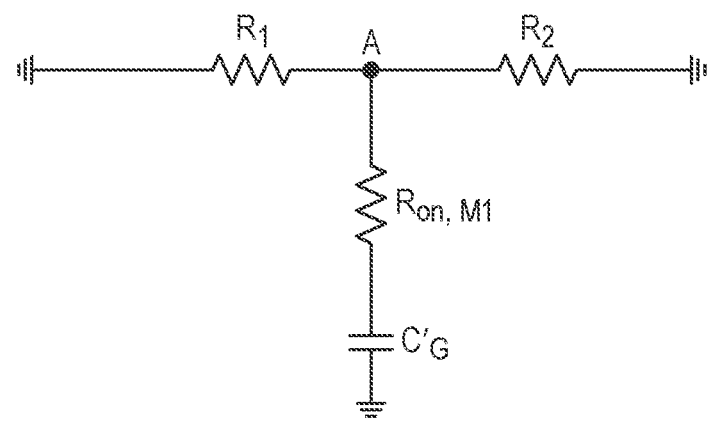
FIGS. 12 and 13 are schematic diagrams of equivalent circuits useful for better understanding the circuit of FIG. 5.

During the tracking mode/phase, $M_1$ in FIG. 5 is ON. In this case, the equivalent resistance seen from the capacitance $C'_G$ can be calculated according the equivalent circuit of FIG. 12. According to this circuit, the equivalent time constant can be calculated as follows:

$$\tau_{track,2} = (R_{on,M1} + R_1 \| R_2) \times C'_G \quad (31)$$

Figure 13:
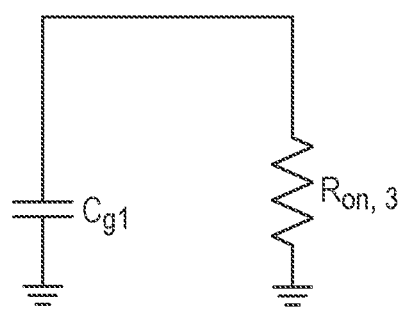

Similarly, in the holding phase (there is no precharge phase), the equivalent RC time constant can be calculated according to FIG. 13.

$$\tau_{hold,2} = R_{on,M2} \times C'_G \quad (32)$$

Similar to (10), the maximum sampling frequency can be calculated as:

$$\omega_{s,max,2} = 2\pi \times f_{s,max,2} = 1/(\tau_{hold,2} + \tau_{track,2}) \quad (33)$$

Substituting (31) and (32) in (33) results in:

$$\omega_{s,max,2} = 2\pi \times f_{s,max,2} = 1/[(R_{on,M1} + R_{on,M2} + R_1 \| R_2) \times C'_G] \quad (34)$$

In order to compare the speed of the two structures, (34) divided by (11) gives:

$$f_{s,max,2}/f_{s,max} \sim [(R_{on,M1} + R_{on,M3}) \times C_B]/[(R_{on,M1} + R_{on,M2} + R_1 \| R_2) \times C'_G] \quad (35)$$

According to FIGS. 7 and 11, the resistors $R_1$ and $R_2$ are advantageously designed small enough to allow enough AC power split from the input node and flowing towards the switching path. This means that $R_1 \| R_2$ would be small and in the same order of the on-resistance of the devices (transistors). For simplicity, as an example rule of thumb (without losing any generality), assume $R_1 \| R_2 \sim R_{on}$. This means that (35) is reduced to:

$$f_{s,max,2}/f_{s,max} \sim [2R_{on} \times C_B]/[3R_{on} \times C'_G] = C_B/(3C'_G) \quad (36)$$

where the on-resistance of all devices are also assumed equal to $R_{on}$. As explained before, $C_B$ would be designed several times larger than $C_G$. On the other hand, $C'_G$ is even smaller than $C_G$ (comparing (12) with (3)). Thus, the maximum sampling frequency of circuit 100 is much higher than of the bootstrapped circuit 10 according to (36).

It is desirable to have a well-defined common mode voltage for the input signal passing through the sampling switch $M_S$. In FIG. 5, this is generated with the first reference signal $V_{REF}$ (DC reference voltage), the second reference signal (ground) and a DC current passing through the resistors $R_1$ to $R_4$ of the potential divider circuit 110. In this case, the common mode voltage can be calculated as:

$$V_{IN,CM} \sim [(R_4 \| R_{eqB})/(R_2 \| R_{eqA} + R_1 + R_3 + R_4 \| R_{eqB})] \times V_{REF} \quad (37)$$

Figure 14:
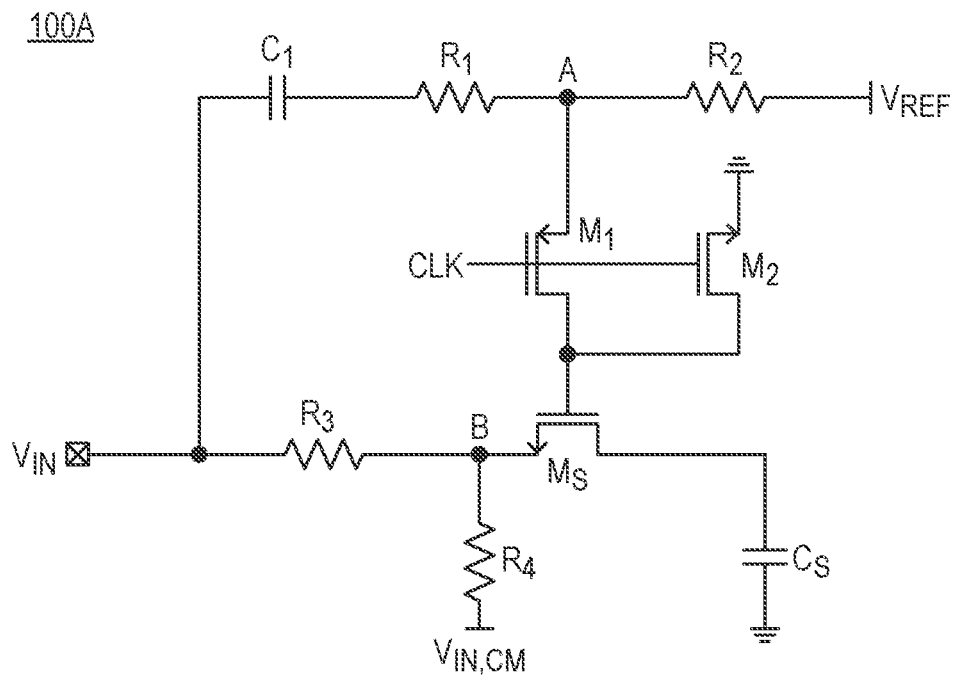
FIG. 14 is a schematic diagram of a sampling switch circuit embodying the present invention.

In another circuit arrangement 100A as shown schematically in FIG. 14, being a variation of circuit 100 of FIG. 5, it is possible to generate the common mode voltage with a reference voltage $V_{IN,CM}$ applied as the second reference signal as shown, and with a decoupling capacitor $C_1$ placed in series with the resistor $R_1$ also as shown. This can result in a better definition of the common mode voltage but with the cost of adding the decoupling capacitor $C_1$.

Figure 15:
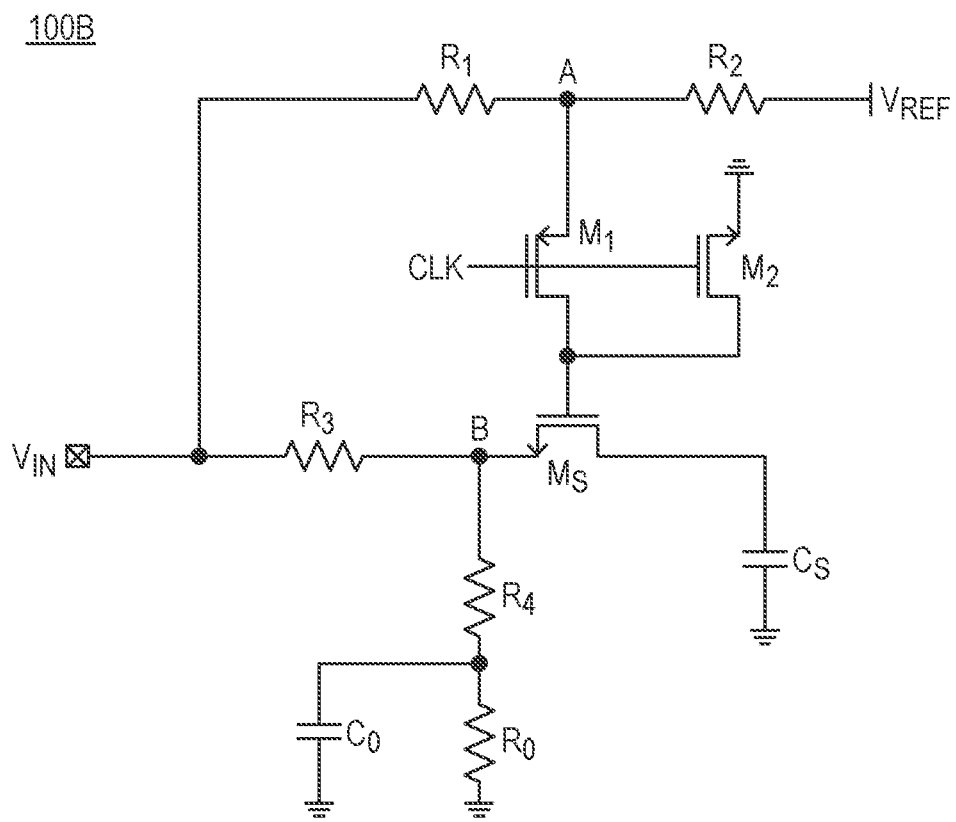
FIG. 15 is a schematic diagram of a sampling switch circuit embodying the present invention.

In another circuit arrangement 100B as shown schematically in FIG. 15, as an alternative to circuit arrangement 100A and being a variation of circuit 100 of FIG. 5, a resistor $R_0$ may be added to the structure of the circuit 100 of FIG. 5 as shown in FIG. 15 in series with the resistor $R_4$ (between $R_4$ and ground) in order to add another degree of freedom in the designing of the common mode voltage. In the arrangement 100B, this resistor $R_0$ is shunted out with a relatively large capacitor $C_0$, such that in the equivalent AC model, the circuit 100 in FIG. 5 is obtained. That is, at high frequencies (of the input signal) the capacitor $C_0$ dominates and effectively the resistor $R_0$ is bypassed.

Figure 16:
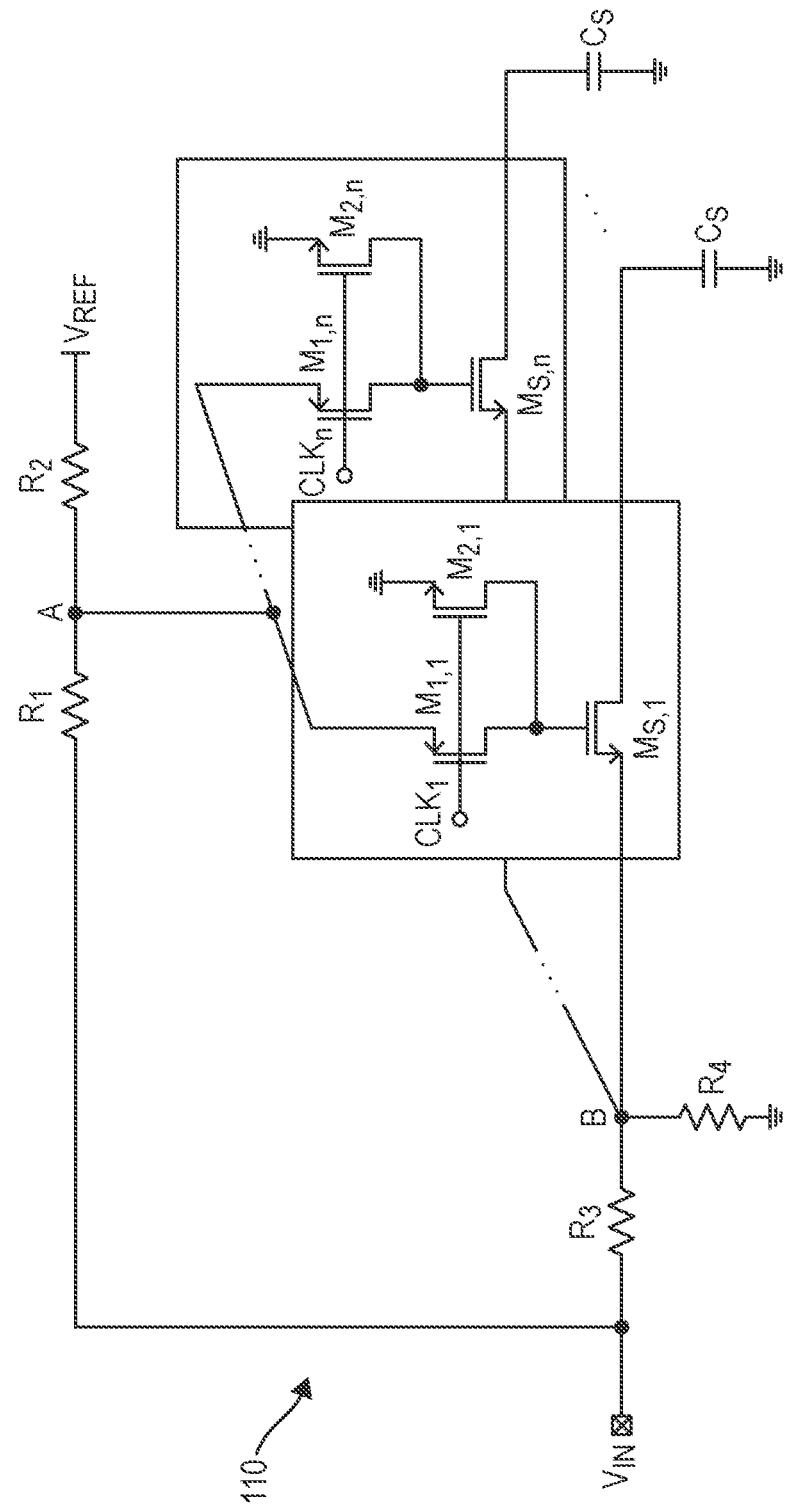
FIG. 16 is a schematic diagram of a sampling switch circuit embodying the present invention.

FIG. 16 is a schematic diagram of another circuit arrangement 100C, configured to comprise multiple channels arranged for time-interleaved operation. It will be appreciated that such a configuration may be useful as the front-end of a time-interleaved ADC.

For simplicity, the circuit 100 of FIG. 5 has been used as the basis of arrangement 100C, with the input node, nodes A and B, the first and second reference signal nodes and the potential divider circuit 110 being common to (i.e. shared between) the different channels.

Each channel then has its own transistors $M_1$, $M_2$ and $M_S$ connected together as in FIG. 5 and controlled by its own clock signal CLK, those components then connected to nodes A and B as in FIG. 5 with the channels effectively connected in parallel as shown, with each having its own output node with a corresponding sampling capacitor $C_S$. The elements in each channel have been labelled accordingly to identify which of n channels they are in. For example, $CLK_1$ is the clock signal for channel 1 and $CLK_n$ is the clock signal for channel n. Similarly, $M_{S,1}$ belongs to channel 1 whereas $M_{S,n}$ belongs to channel n.

It will be appreciated that if the clock signals $CLK_1$ to $CLK_n$ are a set of time-interleaved clock signals then the channels 1 to n will sample the input signal $V_{IN}$ in a time-interleaved fashion. That is, multiple sampling switches ($M_{S,1}$, $M_{S,2}$, ..., $M_{S,n}$) are driven with n clocking circuits (switching circuits 120) which are driven with n sampling clocks ($CLK_1$, $CLK_2$, ... $CLK_n$). As can be seen, the four-transistor per-channel circuit repeats itself with the number of channels and all are powered by node A.

Of course, although the circuit 100 of FIG. 5 has been used as the basis of arrangement 100C, it will be appreciated that any of the other single-channel arrangements disclosed herein (e.g. 100A or 100B described above, or 100D, 100E or 100F, described below) could be used as the basis of a multi-channel arrangement in a similar fashion.

In order to utilize the maximum power of the sampling switch $M_S$ (in other words, having the minimum on-resistance), the gate-source voltage in (21) is preferably designed to be equal to the core supply voltage (i.e., $V_{DD}$):

$$V_{GS,MS} = (g_2/\Sigma g_A) \times V_{REF} = V_{DD} \quad (38)$$

This means that the reference voltage, $V_{REF}$, should preferably be designed such that:

$$V_{REF} = \Sigma g_A \times V_{DD}/g_2 \quad (39)$$

Substituting (38) in (15) results:

$$V_A = (g_1/\Sigma g_A) \times V_{IN} + V_{DD} \quad (40)$$

This means that the voltage on node A would go beyond the core supply voltage. In this case, the devices $M_1$ and $M_2$ in FIG. 5 would experience drain-source and gate-source voltages beyond $V_{DD}$ which could over-stress the transistors and shorten their life time.

Figure 17:
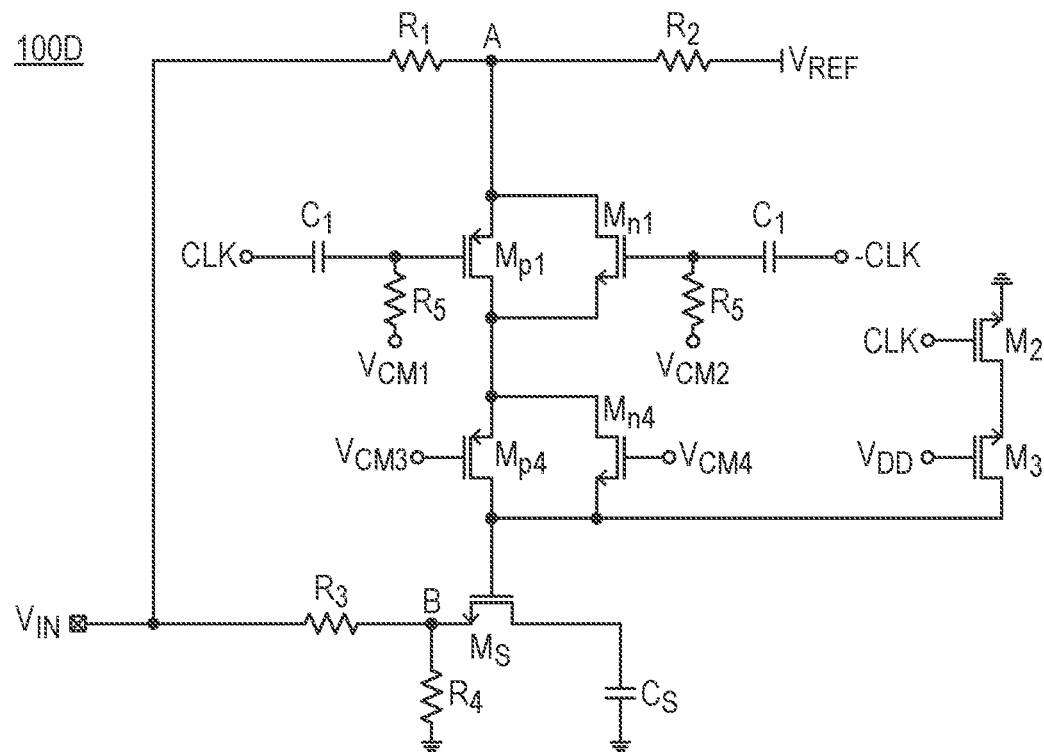
FIG. 17 is a schematic diagram of a sampling switch circuit embodying the present invention.

FIG. 17 is a schematic diagram of another circuit arrangement 100D, being a variation of circuit 100 of FIG. 5, configured to resolve this over-stress issue. Transistor $M_3$ is added to protect $M_2$ when CLK is low. This guarantees that the drain voltage of $M_2$ remains below $V_{DD}$ when it is OFF. Similarly, transistors $M_{p4}$, and $M_{n4}$ are added to the circuit in order to protect transistors $M_{p1}$, $M_{n1}$ when CLK is high. The gates of $M_{p4}$, and $M_{n4}$ are biased with suitable common mode voltages, $V_{CM3,4}$. Also, DC voltages $V_{CM1,2}$ are added to the sampling clocks (i.e., CLK, and –CLK) through resistors $R_5$ and decoupling capacitors $C_1$. It should be noted that these capacitors are added simply to AC couple the clock signal to the gate of transmission gate $M_{p1,n1}$, and, contrary to the bootstrap circuit 10 of FIG. 2, they are not switched on/off in the circuit. All the above mentioned voltages, $V_{CM1}$-$V_{CM4}$, are DC voltages in this example and may be generated from the reference voltage, $V_{REF}$ (e.g. by potential dividers).

The circuit 100D in FIG. 17 can also be used in a time-interleaved structure equivalent to that shown in FIG. 16 as mentioned earlier.

It is noted that the transmission gates in FIG. 17 (i.e., transistors $M_{p1,n1}$ and $M_{p4,n4}$) have fairly constant on-resistances when the CLK is low. In this case, the circuit can be simplified.

Figure 18:
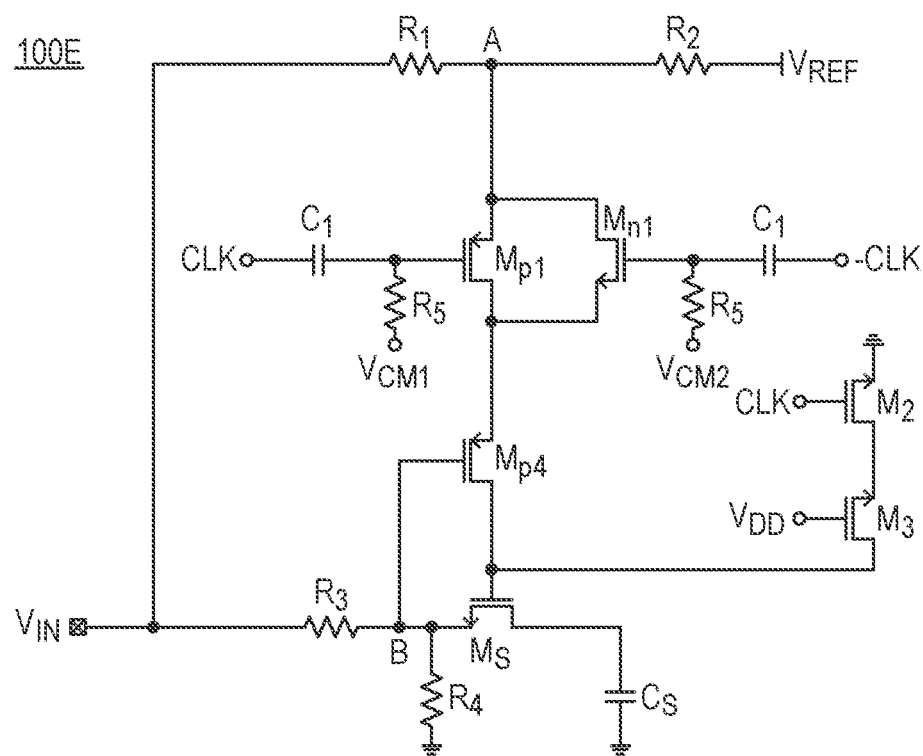
FIG. 18 is a schematic diagram of a sampling switch circuit embodying the present invention.

FIG. 18 is a schematic diagram of another circuit arrangement 100E, being a variation of circuit 100 of FIG. 5, configured as a simplified version of circuit arrangement 100D.

In the circuit 100E of FIG. 18, the gate of transistor $M_4$ is connected to node B. In this case, when CLK is low, the gate-source voltage over this device is constant similar to the sampling switch, $M_S$. This removes the need for a transmission gate ($M_{p4}$, and $M_{n4}$ as in FIG. 17) and also the DC voltages, $V_{CM3,4}$.

The circuit 100E in FIG. 18 can also be used in a time-interleaved structure equivalent to that shown in FIG. 16 as mentioned earlier.

At high input frequencies, the amount of the input signal power passing through the sampling switch (through node B in FIG. 18) and also the clocking path (through node A) decreases. This limits the bandwidth of the sampling circuit 100E and eventually of an ADC comprising it.

Figure 19:
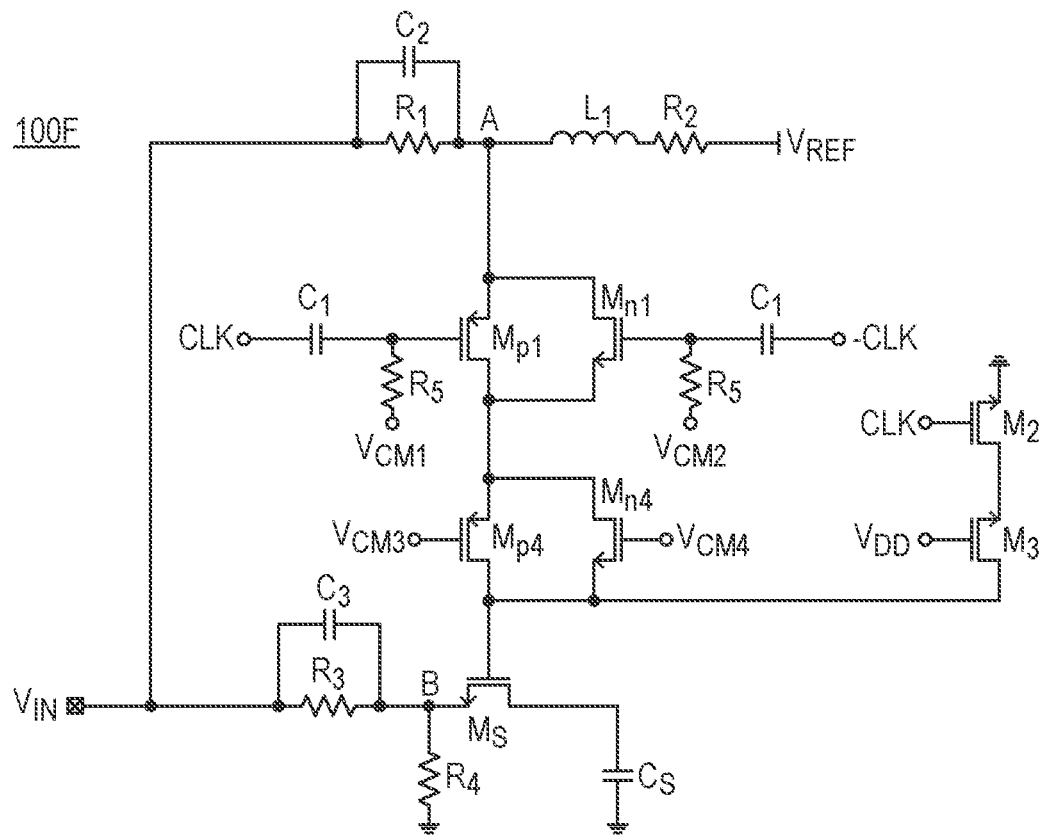
FIG. 19 is a schematic diagram of a sampling switch circuit embodying the present invention.

FIG. 19 is a schematic diagram of another circuit arrangement 100F, being a variation of circuit 100D of FIG. 17, configured in order to compensate for this bandwidth limitation. Two capacitors ($C_2$, and $C_3$) have been added to the circuit structure of FIG. 17 (similarly, they could be added to the circuit structure of e.g. FIG. 5 or 18) as shown. $C_2$ is in parallel with $R_1$ and $C_3$ is in parallel with $R_3$. Inductor $L_1$ has also been added to the circuit structure, in series with $R_2$, to increase the impedance seen from the reference branch (i.e., resistor $R_2$ connected to $V_{REF}$) and help capacitor $C_2$ to increase the signal level on node A.

In this case, the voltage on node A (in s-domain) can be calculated by modifying (15) as follows:

$$V_A = V_{IN} \times (g_1 + sC_2) \times (R_2 + sL_1)/[1 + (g_{eqA} + g_1 + sC_2) \times (R_2 + sL_1)] + V_{REF}/[1 + (g_{eqA} + g_1 + sC_2) \times (R_2 + sL_1)] \quad (41)$$

On the other hand, the voltage on node B (in s-domain) in FIG. 19 can be calculated by modifying (17) as follows:

$$V_B = (g_3 + sC_3)/(g_3 + \Sigma g_B + sC_3) \times V_{IN} \quad (42)$$

where $\Sigma g_B$ is defined in (18).

At high input frequencies, i.e., $s = \infty$, equations (41) and (42) are reduced to:

$$V_A \sim V_B \sim V_{IN} \quad (43)$$

Comparing the high frequency values of $V_B$ in (43) with (17) suggests that the amount of high frequency "boost" in the signal comparing to its low frequency values can be calculated by dividing (43) by (17):

$$G = (g_3 + \Sigma g_B)/g_3 = 1 + \Sigma g_B/g_3 \quad (44)$$

This amount of gain acts as an equalizer that can enhance the bandwidth of the sampler circuit 100F in FIG. 19 and consequently an ADC comprising it.

Of course, $C_2$, $C_3$ and $L_1$ could be employed in a similar fashion in any of circuits 100 and 100A to 100E (or 100G described below).

Depending on the application and the required specifications of the sampling switch circuit in a practical implementation, the reference voltage, $V_{REF}$, may need to be designed with a value higher than the core supply voltage (i.e., $V_{DD}$), (see equation (39)). IO supply voltages may for example be available any may be used as the reference voltage to generate the constant gate-source voltage over the sampling switch $M_S$ close to $V_{DD}$. As another option, the reference voltage could be generated using e.g., a boost DC to DC converter.

Figure 20:
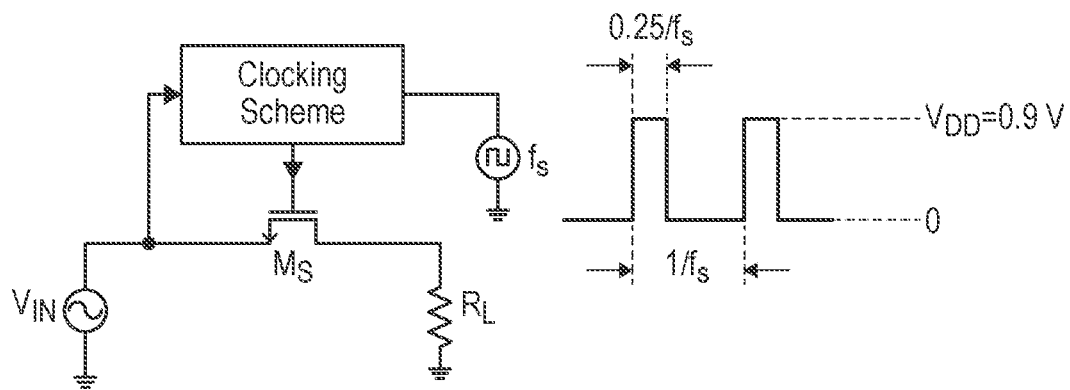
FIG. 20 is a schematic diagram representing a test bench used to compare operation of the circuit of FIG. 2 with that of FIG. 18.

FIG. 20 is a schematic diagram representing a test bench used to compare operation of the circuit 100E (FIG. 18) with the circuit 10 (FIG. 2). The "clocking scheme" was thus set up in the tests to simulate the operation of circuits 100E and 10, in a 7 nm FinFet CMOS technology. The on-resistance of the sampling switch $M_S$ was measured and compared between the two "clocking methods" (i.e. circuits 10 and 100E). In the results shown in FIGS. 21 and 22, those that relate to circuit 10 are labelled "conventional" and those that relate to circuit 100E are labelled "proposed".

Figure 21:
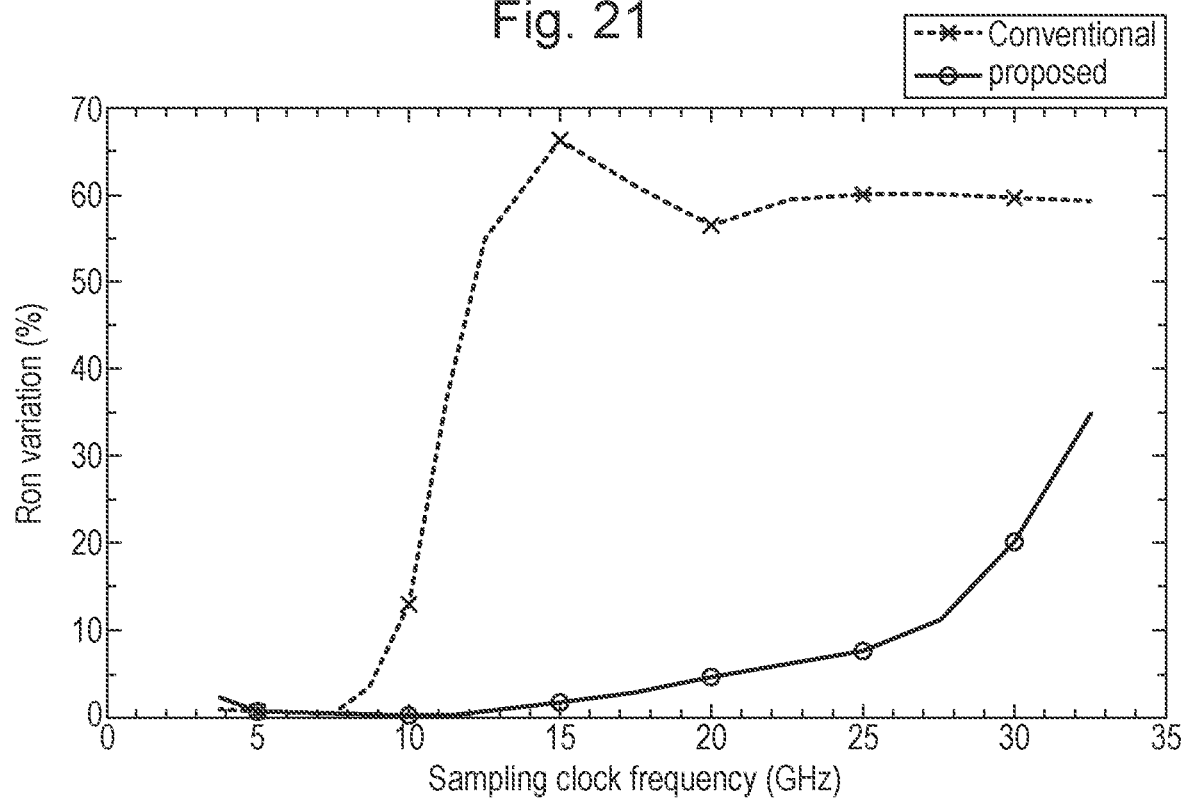
FIG. 21 is a graph showing the amount of on-resistance variation for the circuits of FIGS. 2 and 18.

FIG. 21 is a graph shows the amount of on-resistance variation (due to the input voltage swing) for the two clocking methods (i.e. circuits 10 and 100E) with respect to the sampling clock frequency. As shown in FIG. 20, the clock frequency is $f_s$ and the duty cycle is 0.25. This means that the tracking time is $0.25/f_s$. In a four-phase sampler front-end structure (shown later in FIG. 23) this corresponds to a sampling frequency of $4 \times f_s$. As can be seen in FIG. 21, the performance for circuit 10 very quickly saturates and reaches a relatively large Ron variation with respect to the sampling frequency. On the other hand, the performance for circuit 100 keeps a reasonable performance up to very high sampling frequencies.

It is worth mentioning that the variation shown in FIG. 21 is with respect to the input voltage for different sampling frequencies. Larger variations results in higher harmonic distortion and eventually lower effective number of bits (ENOB), spurious free dynamic range (SFDR) and in total a reduced dynamic performance of an ADC comprising the circuit concerned.

Figure 22:
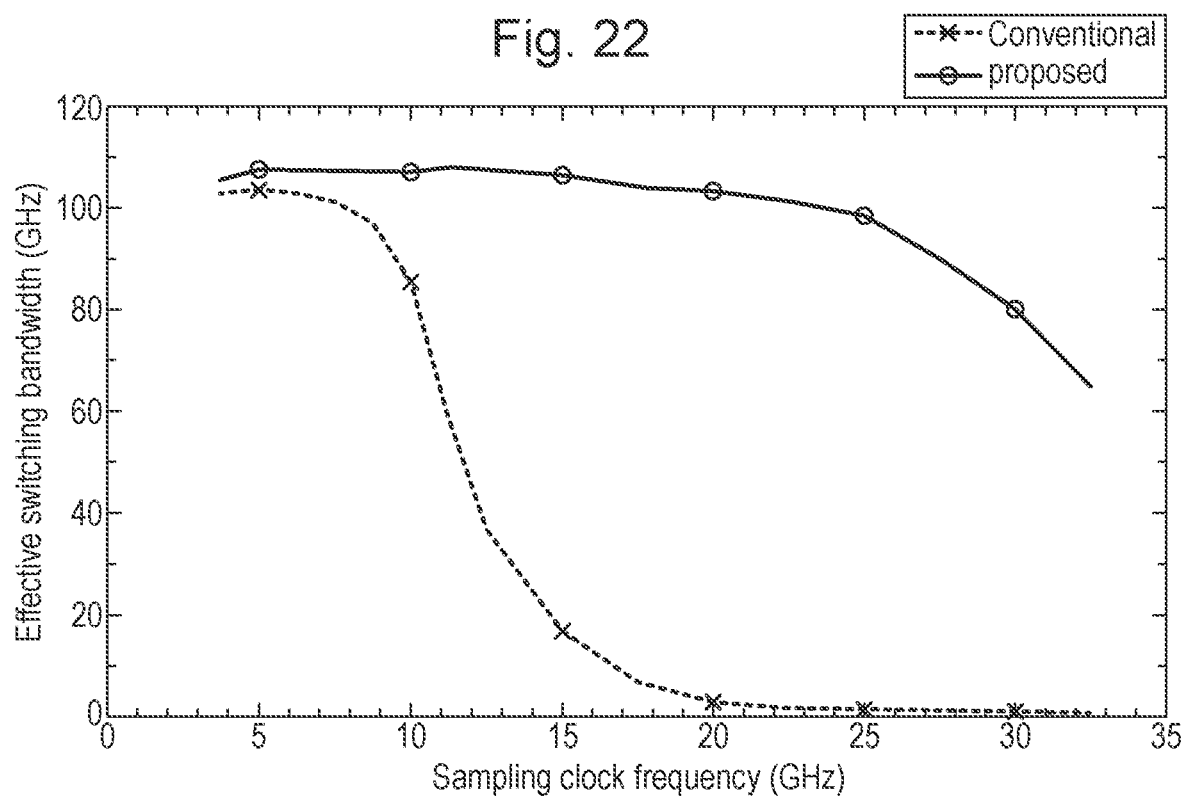
FIG. 22 is a graph showing the effective bandwidth (EBW) of the sampling switch for the circuits of FIGS. 2 and 18.

FIG. 22 is a graph showing the effective bandwidth (EBW) of the sampling switch $M_S$ (with respect to the sampling frequency $f_s$ defined in FIG. 20) defined as follows:

$$EBW=(1/2\pi)\times 1/(R_{on,ave}\times C_S) \quad (45)$$

where $R_{on,ave}$ is the average on-resistance (with respect to the input signal amplitude) and $C_S$ is the sampling capacitor.

As can be seen in the results of FIG. 22, the proposed switching approach (FIG. 18) shows a much better effective bandwidth comparing to the technique of FIG. 2. It is worth mentioning that depending on the required resolution (and ENOB), the effective bandwidth (which represents the RC time constant of the switch $M_S$) should be several times higher than the sampling clock frequency. In the conventional curve case (i.e., the bootstrapped technique of FIG. 2), the ratio of the effective bandwidth over the sampling frequency (i.e., $EBW/f_s$) drops below unity for sampling frequencies higher than around 14 GHz while the proposed approach of FIG. 18 keeps the ratio of more than 2 up to more than 30 GHz of sampling frequency.

Figure 23:
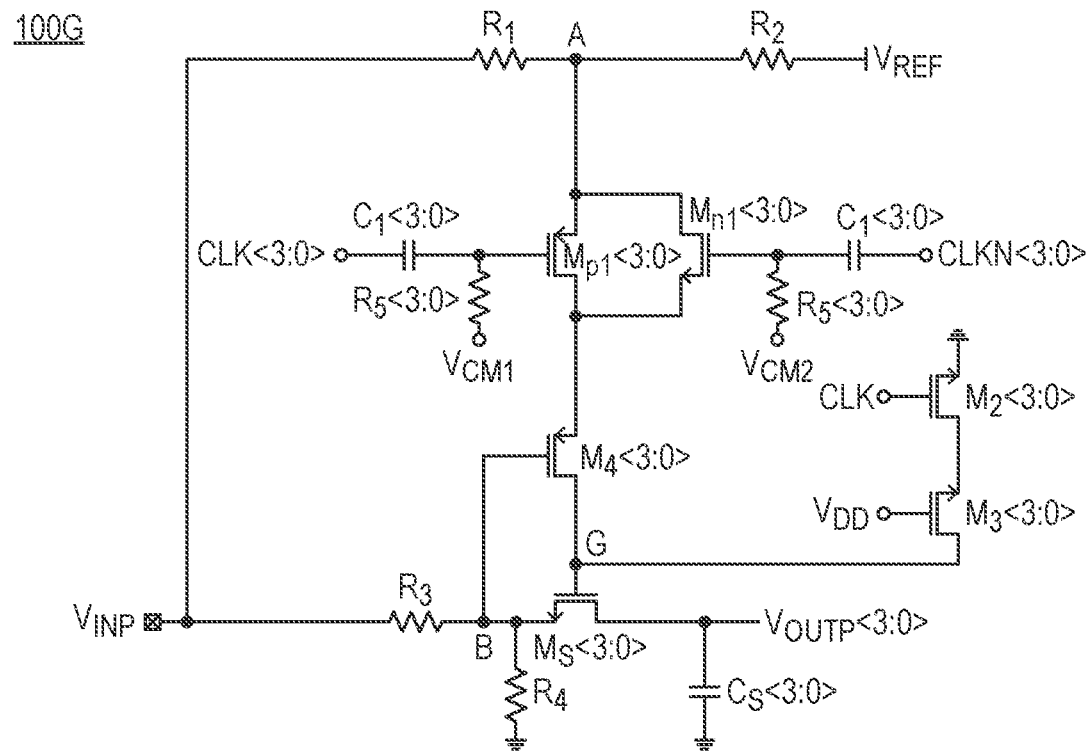
FIG. 23 is a schematic diagram of a sampling switch circuit embodying the present invention, used for simulation.

FIG. 23 is a schematic diagram of another circuit arrangement 100G, equivalent to that of FIG. 16 but based on the circuit of FIG. 18 rather than of FIG. 5, used for further simulation. The circuit 100G is a four-phase configuration of that of FIG. 18 (e.g. for use as a time-interleaved sampler front-end structure), where <3:0> indicates an array of four components connected in parallel channel sub-circuits. As in FIG. 16, the input node, nodes A and B, the first and second reference signal nodes and the potential divider circuit 110 are common to (i.e. shared between) the different channels.

Figure 24:
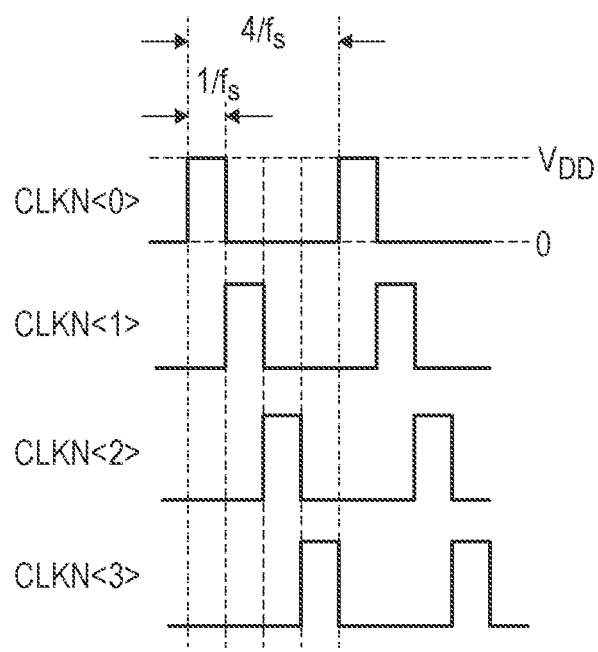
FIG. 24 is a schematic diagram of clock signals corresponding to FIG. 23.

In FIG. 23, CLK<3:0> and CLKN<3:0> are four-phase clocks with duty cycle of 0.25 for CLKN<3:0> and 0.75 for CLK<3:0>. The clock signals CLKN<3:0> are shown in FIG. 24 (CLK<3:0> are the same but inverted). In this case, $V_{DD}$=0.9 V, and each clock has a frequency of $f_s/4$ where $f_s$ is the sampling frequency. In this example simulation, the circuit was designed for $f_s$=100 GSa/s or 100 GHz (i.e., each clock phase is 25 GHz). Also, the output voltage swing was set to be 0.5 Vpeak-peak differential. The circuit in FIG. 23 was simulated in a fully differential structure (although depicted in single-ended form in FIG. 23).

Figure 25:
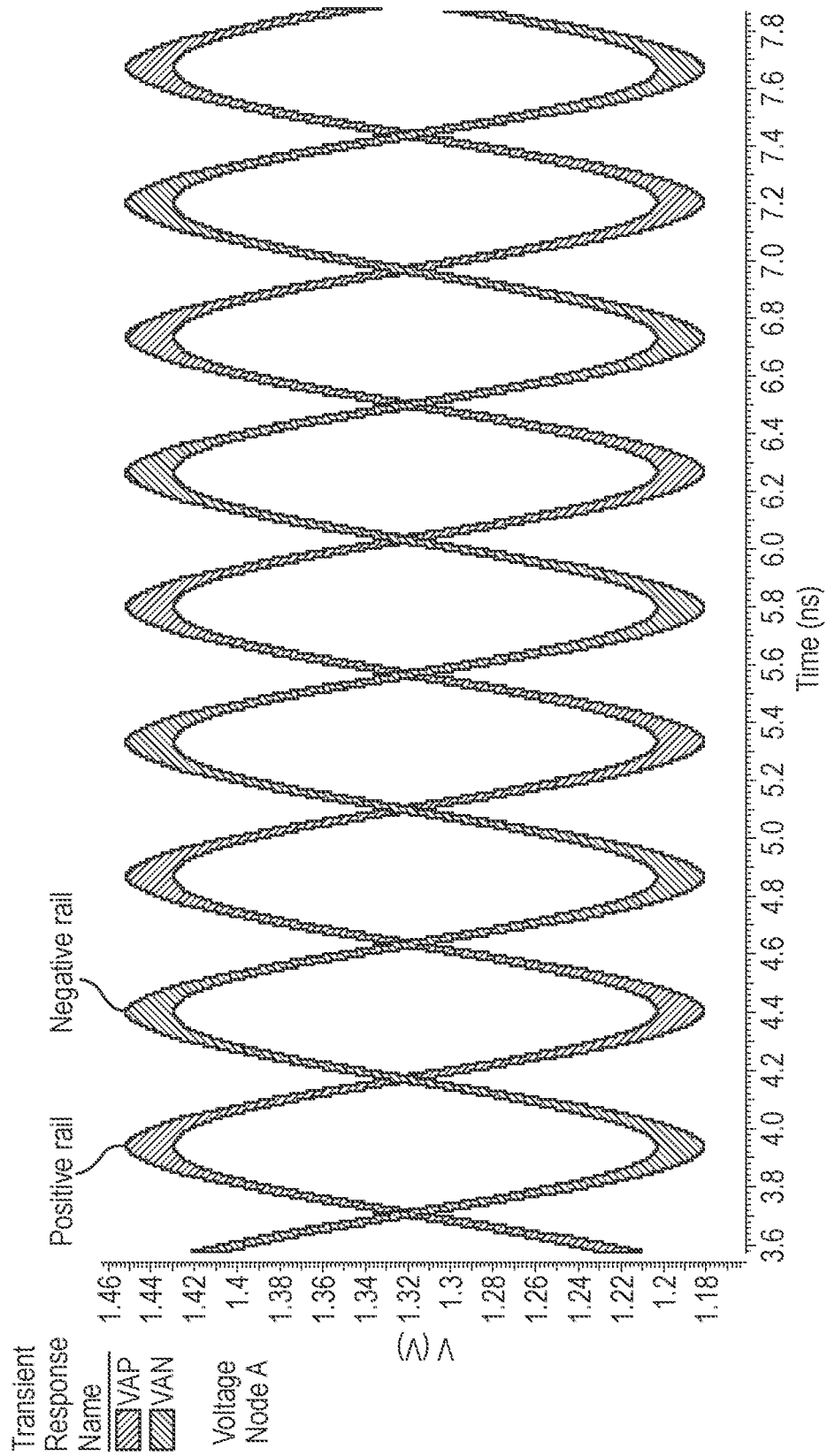
FIGS. 25 to 27 show waveforms respectively on nodes A (FIG. 25) and G (FIG. 26) for both positive and negative rail circuits, and the output (FIG. 27) for all four phases in relation to a simulation of the FIG. 23 circuit.
Figure 26:
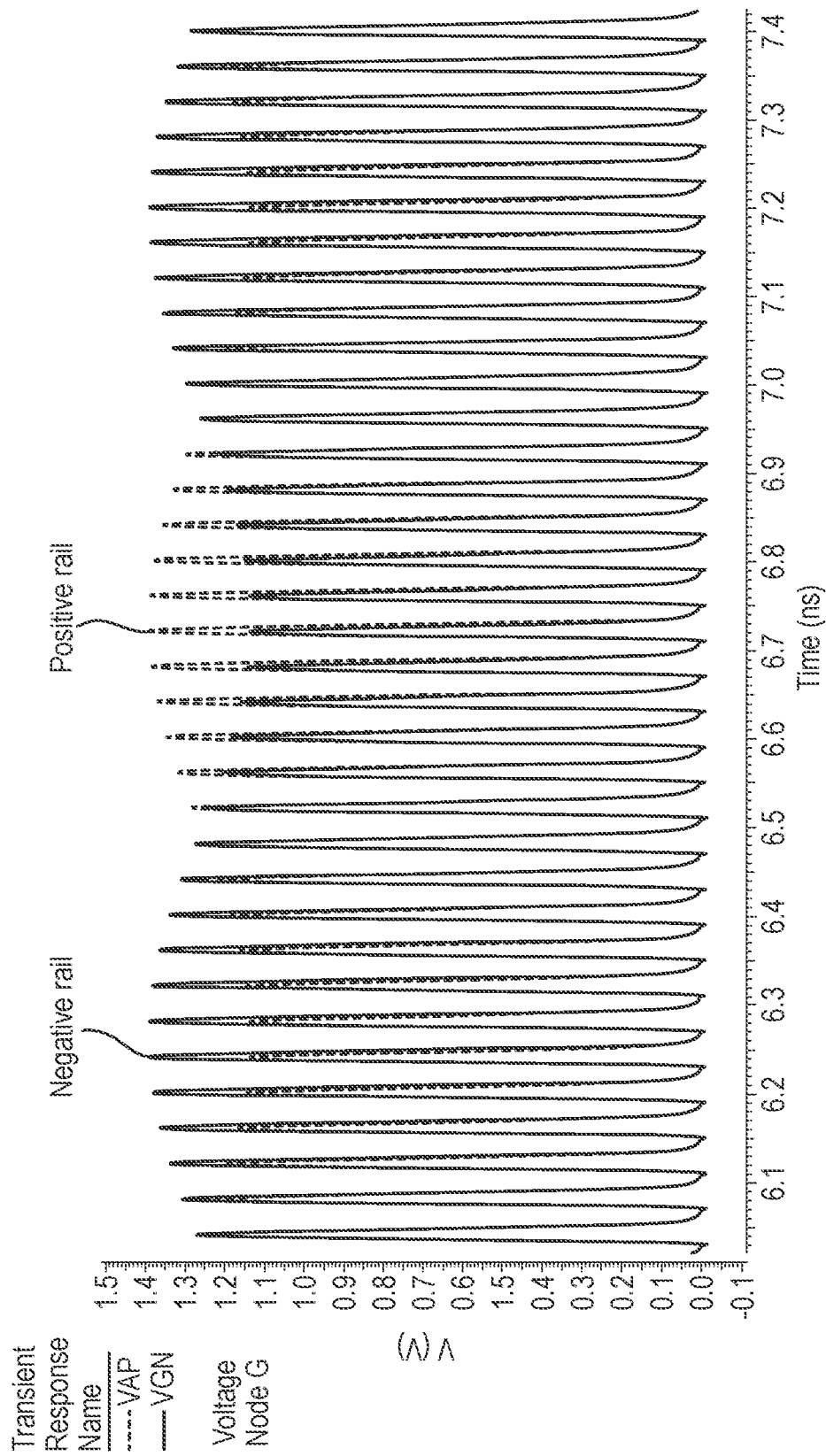
Figure 27:
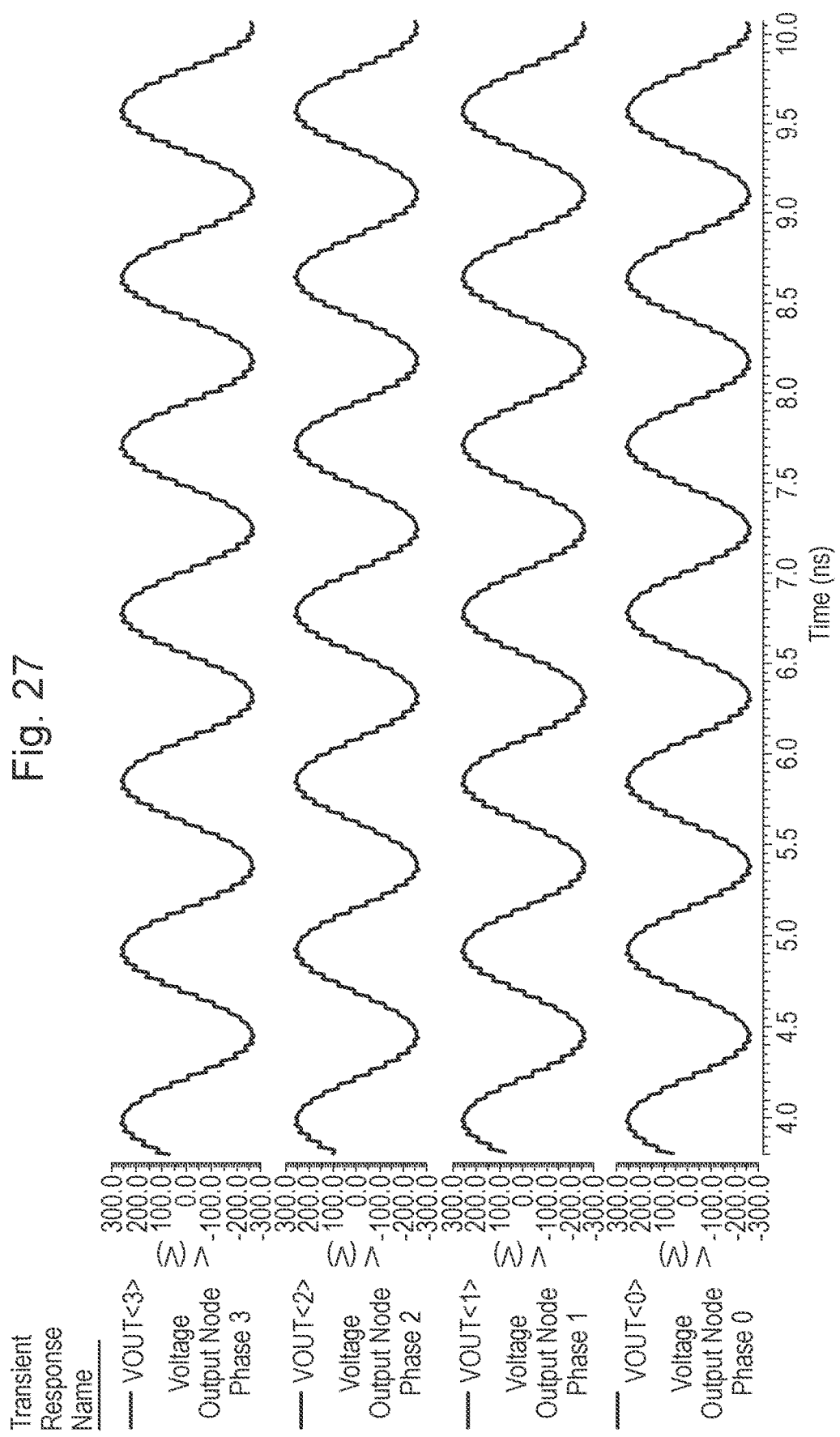

FIGS. 25 to 27 show the waveforms respectively on nodes A (FIG. 25) and G (FIG. 26) for both positive and negative rail circuits, and the output $V_{OUT}$ for all four phases (FIG. 27). The circuit was designed (as an example) for a 50 ohms characteristic impedance. Also, the input frequency was set to be around 1 GHz.

Figure 28:
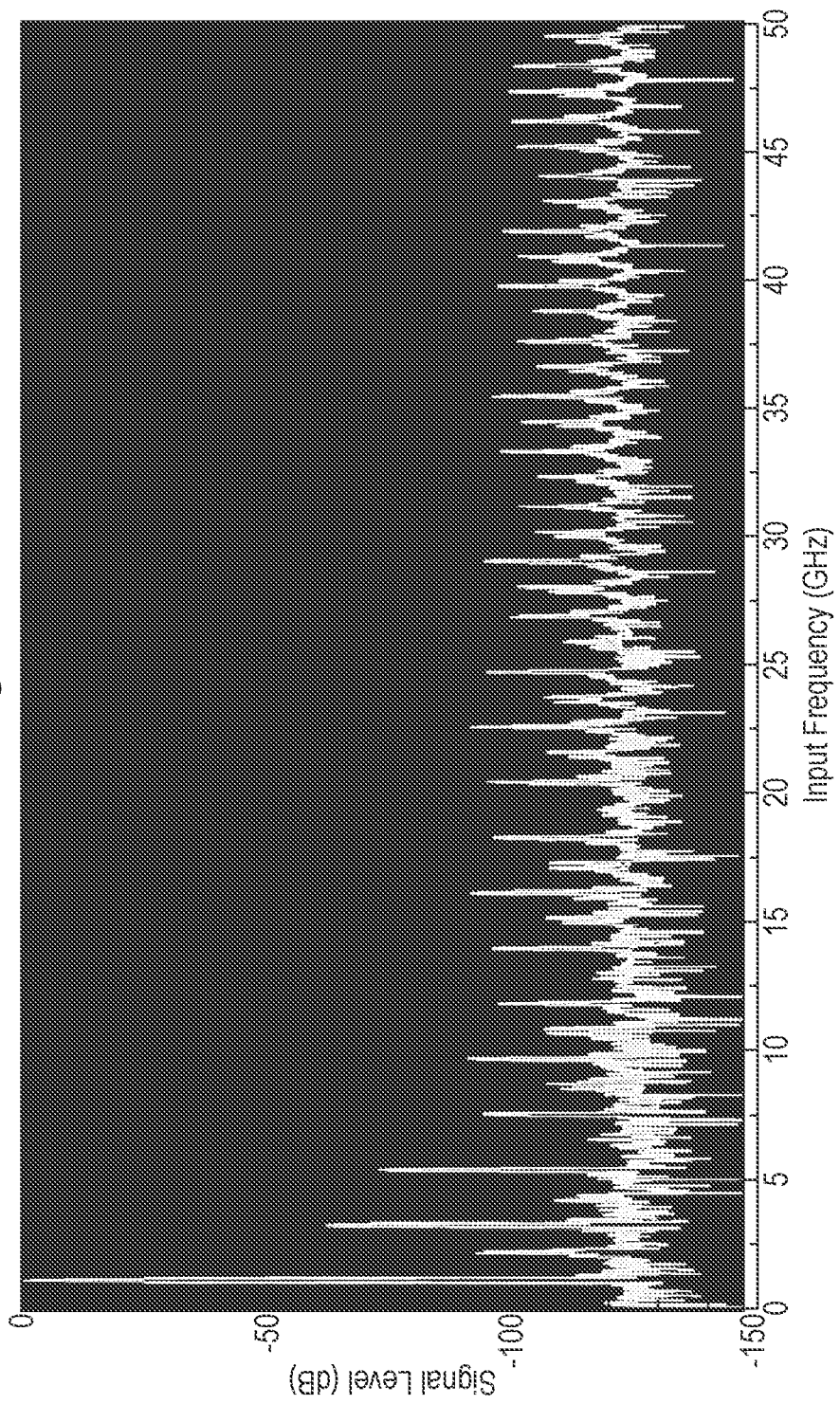
FIG. 28 shows an FFT spectrum corresponding to FIG. 27.

The four phase output signals in FIG. 27 were recombined to a single signal and its FFT spectrum was calculated and is shown in FIG. 28. In this example simulation, an ENOB of around 10 bits was found which shows the effectiveness of the proposed technique (FIG. 18) at a high sampling frequency.

In summary, the embodiments disclosed herein enable, removal of the bulky capacitor $C_B$ from the switching path to speed up the clocking (in other words, by removing the precharge phase), removal of the intrinsic delay and controlling all the switches by the clock signals in order to speed up the clocking, providing the power of the clocking path by splitting the power between the clocking path and the input signal path, and introducing equalization and enhancing the bandwidth of the circuit by boosting the input signal (power flowing through the clocking path and the signal path) at high input frequencies.

It is advantageous to remove the precharge phase. The voltage $V_{IN}+V_{DD}$ is constantly available (i.e. maintained at node A) which is used during the tracking phase. The number of transistors is significantly reduced (e.g. compare FIG. 5 to FIG. 2) to create reduced parasitic capacitance. Also, the clocking circuitry just deals with one gate capacitance which belongs to the sampling switch $M_S$. Further, the states of all devices are controlled with the clock directly and the intrinsic delay of FIG. 2 is removed from the structure.

Figure 29:
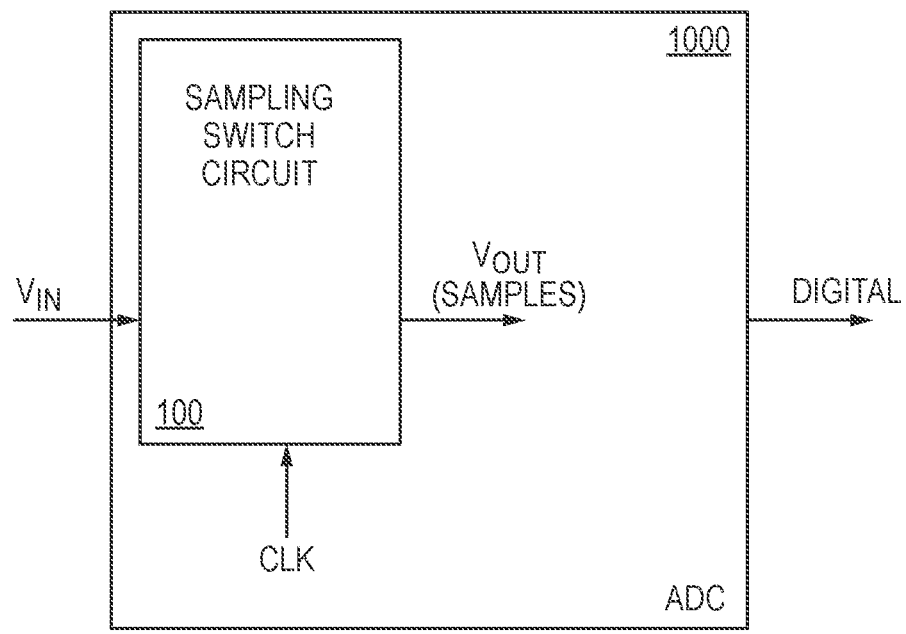
FIG. 29 is a schematic diagram of an ADC embodying the present invention.

As mentioned above, a sampling switch circuit embodying the present invention may be implemented as part of an ADC, for example as its front-end to generate voltage mode samples $V_{OUT}$ of a input signal $V_{IN}$, at a sample rate defined by a clock signal CLK as described earlier. FIG. 29 is a schematic diagram of such an ADC 1000 embodying the present invention. The ADC 1000 comprises any of the sampling switch circuits 100 and 100A to 100G disclosed herein, indicated as 100 in FIG. 29 for simplicity. The ADC 1000 may in turn output a digital signal, as shown, based on the voltage mode samples $V_{OUT}$.

Figure 30:
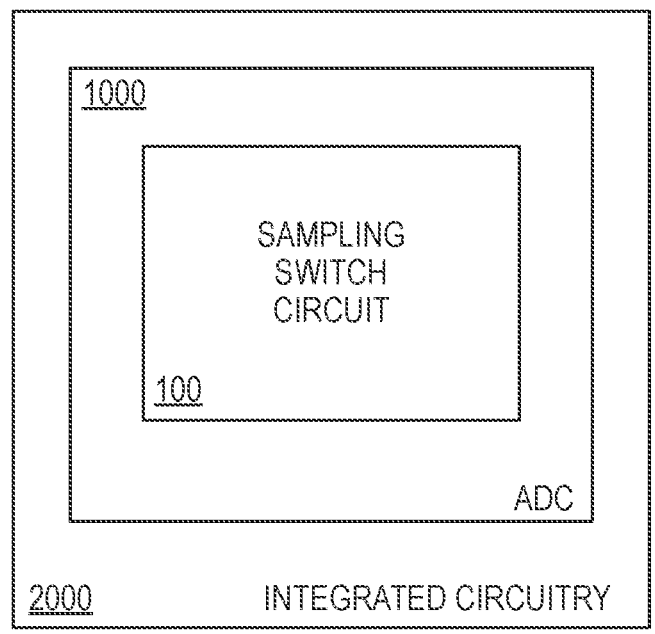
FIG. 30 is a schematic diagram of integrated circuitry embodying the present invention.

Any of the circuitry disclosed herein may be implemented as integrated circuitry or as an integrated circuit, for example as (or as part of) and IC chip, such as a flip chip. FIG. 30 is a schematic diagram of integrated circuitry 2000 embodying the present invention. The integrated circuitry 2000 may comprise the ADC 1000 and/or any of the sampling switch circuits 100 and 100A to 100G disclosed herein, indicated as 100 in FIG. 30 for simplicity Integrated circuitry 2000 may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A sampling switch circuit, comprising:
 an input node, connected to receive an input voltage signal to be sampled;
 a sampling transistor comprising a gate terminal, a source terminal and a drain terminal, the source terminal connected to the input node;
 a potential divider circuit connected to the input node and a track-control node to provide a track-control voltage signal dependent on the input voltage signal at the track-control node;
 a hold-control node connected to receive a hold-control voltage signal;
 an output node connected to the drain terminal of the sampling transistor; and
 switching circuitry configured to connect the gate terminal of the sampling transistor to the track-control node or to the hold-control node in dependence upon a clock signal.

2. The sampling switch circuit as claimed in claim 1, wherein:
 the potential divider circuit is configured such that, when the gate terminal of the sampling transistor is connected to the track-control node, the sampling transistor is ON and a voltage at the drain terminal of the sampling transistor and/or the output node tracks a voltage at the source terminal of the sampling transistor; and/or
 when the gate terminal of the sampling transistor is connected to the hold-control node, the sampling transistor is OFF and a voltage at the drain terminal of the sampling transistor and/or at the output node is at least temporarily maintained or held.

3. The sampling switch circuit as claimed in claim 2, wherein the track-control voltage signal has a track-control AC component defined at least by the input voltage signal and a track-control DC component defined at least by the potential divider circuit.

4. The sampling switch circuit as claimed in claim 3, wherein the potential divider circuit is configured to maintain the track-control voltage signal at the track-control node, optionally with the track-control AC component maintained as defined at least by the input voltage signal and the track-control DC component maintained as defined at least by the potential divider circuit, optionally as continuous signals and optionally independently of the clock signal.

5. The sampling switch circuit as claimed in claim 3, wherein the potential divider circuit is connected to a sample node to provide a sample voltage signal at the sample node which has a sample AC component defined at least by the input voltage signal and a sample DC component defined at least by the potential divider circuit, the source terminal of the sampling transistor connected to the sample node and connected to the input node via the sample node.

6. The sampling switch circuit as claimed in claim 5, wherein the potential divider circuit is configured to maintain the sample voltage signal at the sample node, optionally with the sample AC component maintained as defined at least by the input voltage signal and the sample DC component maintained as defined at least by the potential divider circuit, optionally as continuous signals and optionally independently of the clock signal.

7. The sampling switch circuit as claimed in claim 5, wherein the potential divider circuit is configured such that the track-control DC component and the sample DC component are different from one another in voltage level.

8. The sampling switch circuit as claimed in claim 1, wherein:
the potential divider circuit is connected to a first reference node and a second reference node, the first reference node connected to receive a first reference voltage signal having a first reference DC component and the second reference node connected to receive a second reference voltage signal having a second reference DC component; and
the first reference DC component and the second reference DC component are configured to cause the difference between voltage levels of the track-control DC component and the sample DC component to be greater than or equal to the threshold voltage of the sampling transistor.

9. The sampling switch circuit as claimed in claim 8, wherein the potential divider circuit comprises:
a first impedance connected between the input node and the track-control node;
a second impedance connected between the track-control node and the first reference node;
a third impedance connected between the input node and the sample node; and
a fourth impedance connected between the sample node and the second reference node.

10. The sampling switch circuit as claimed in claim 9, wherein:
the first impedance is implemented as a resistor or as a resistor connected in series with a capacitor, or as a resistor connected in parallel with a capacitor, or as a capacitor connected in series with a parallel combination of impedances, the parallel combination of impedances comprising a resistor connected in parallel with a capacitor; and/or
the second impedance is implemented as a resistor, or as a resistor connected in series with an inductor; and/or
the third impedance is implemented as a resistor, or as a resistor connected in parallel with a capacitor; and/or
the fourth impedance is implemented as a resistor, or as a resistor connected in series with a parallel combination of impedances, that parallel combination of impedances comprising a resistor connected in parallel with a capacitor, optionally wherein that parallel combination of impedances is connected to the second reference node.

11. The sampling switch circuit as claimed in claim 1, wherein the hold-control voltage signal has a hold-control DC component, and a difference between voltage levels of the hold-control DC component and the sample DC component is less than the threshold voltage of the sampling transistor.

12. The sampling switch circuit as claimed in claim 1, wherein the switching circuitry comprises a first switch connected between the gate terminal of the sampling transistor and the track-control node and a second switch connected between the gate terminal of the sampling transistor and the hold-control node,
optionally wherein the first and second switches are implemented with transistors,
optionally wherein:
the first switch is connected in series with a resistance between the gate terminal of the sampling transistor and the track-control node, optionally wherein that resistance is implemented with one or more transistors; and/or
the second switch is connected in series with a resistance between the gate terminal of the sampling transistor and the hold-control node, optionally wherein that resistance is implemented with one or more transistors.

13. The sampling switch circuit as claimed in claim 1, configured to have multiple channels, wherein:
each said channel comprises its own said sampling transistor, output node, switching circuitry and clock signal; and
for each said channel, the source terminal of the sampling transistor is connected to the input node, the output node is connected to the drain terminal of the sampling transistor, and the switching circuitry is configured to connect the gate terminal of the sampling transistor to the track-control node or to the hold-control node in dependence upon the clock signal.

14. An analogue-to-digital converter, comprising the sampling switch circuit as claimed in claim 1.

15. Integrated circuitry, such an IC chip, comprising the sampling switch circuit as claimed claim 1.

* * * * *